(12) United States Patent
Wakabayashi et al.

(10) Patent No.: US 7,411,794 B2
(45) Date of Patent: Aug. 12, 2008

(54) CARRIER UNIT FOR A SEMICONDUCTOR DEVICE AND SEMICONDUCTOR SOCKET USING THE SAME

(75) Inventors: Yoshinori Wakabayashi, Tokyo (JP); Minoru Hisaishi, Tokyo (JP); Takeyuki Suzuki, Yokohama (JP); Noriyuki Matsuoka, Yokohama (JP)

(73) Assignee: Yamaichi Electronics Co., Ltd. (JP)

( * ) Notice: Subject to any disclaimer, the term of this patent is extended or adjusted under 35 U.S.C. 154(b) by 0 days.

(21) Appl. No.: 11/387,797

(22) Filed: Mar. 24, 2006

(65) Prior Publication Data
US 2006/0232291 A1   Oct. 19, 2006

(30) Foreign Application Priority Data
Mar. 25, 2005   (JP)   ............................. 2005-089451
Mar. 7, 2006    (JP)   ............................. 2006-061785

(51) Int. Cl.
*H05K 5/00*   (2006.01)

(52) U.S. Cl. ........................... 361/752; 361/749; 365/52

(58) Field of Classification Search ................. 361/752, 361/784, 808, 749; 257/686; 365/52; 336/200
See application file for complete search history.

(56) References Cited

U.S. PATENT DOCUMENTS

| | | | |
|---|---|---|---|
| 6,905,952 B2 * | 6/2005 | Suzuki et al. | ............... 438/612 |
| 6,910,898 B2 * | 6/2005 | Suzuki et al. | ............... 439/73 |
| 2004/0009682 A1 * | 1/2004 | Suzuki et al. | ............... 439/73 |
| 2005/0250363 A1 | 11/2005 | Suzuki et al. | |
| 2005/0258850 A1 | 11/2005 | Yamada et al. | |
| 2006/0071331 A1 * | 4/2006 | Kuroda et al. | ............... 257/727 |
| 2006/0150403 A1 * | 7/2006 | Haager et al. | ............... 29/830 |

FOREIGN PATENT DOCUMENTS

| | | |
|---|---|---|
| JP | 2000-003768 | 1/2000 |
| JP | 2003-297521 | 10/2003 |
| JP | 2004-47186 | 2/2004 |
| JP | 2004-220865 | 8/2004 |
| JP | 2004-241377 | 8/2004 |

OTHER PUBLICATIONS

Office Action dated Mar. 28, 2008 in corresponding Japanese Patent Application No. 2006-061785.

* cited by examiner

*Primary Examiner*—Tuan T Dinh
*Assistant Examiner*—Abiy Getachew
(74) *Attorney, Agent, or Firm*—Finnegan, Henderson, Farabow, Garrett & Dunner LLP

(57) ABSTRACT

In a carrier unit, a posture-stabilizing member 30 for stabilizing a bare chip to be generally parallel to a flat surface of an electrode sheet 32 is placed on the electrode sheet 32 in a carrier unit 21.

9 Claims, 27 Drawing Sheets

CARRIER UNIT FOR A SEMICONDUCTOR DEVICE AND SEMICONDUCTOR SOCKET USING THE SAME

This application claims priority from Japanese Patent Applications Nos. 2005-89451 filed Mar. 25, 2005 and 2006-61785 filed Mar. 7, 2006, which are hereby incorporated by references herein.

BACKGROUND OF THE INVENTION

1. Field of the Invention

The present invention relates to a carrier unit for a semiconductor device provided with an electrode sheet and semiconductor socket using the same.

2. Description of the Prior Art

A socket used for a burn-in test for a semiconductor device to be mounted to electronic equipment is generally referred to as an IC socket. In a test for KGD (known Good Die) which is a tested acceptable bare chip as a conforming item among the semiconductor devices, the KGD is mounted to a portion of the IC socket for accommodating the bare chip by a carrier unit detachachable therefrom, as disclosed, for example, in Japanese Patent Application Laid-open Nos. 2004-047186 and 2004-220865.

As disclosed also in Japanese Patent Application Laid-open No. 2004-047186, the carrier unit includes, as main elements, a carrier housing having a portion for accommodating a bare chip, an electrode sheet disposed on a inner bottom of the accommodating portion of the carrier housing via an elastic sheets a pressing lid for pressing a group of electrodes in the bare chip to a group of bumps in the electrode sheet, and a latch mechanism for selectively retaining the pressing lid on the carrier housing.

The electrode sheet as a contact sheet (trade mark) has a plurality of bumps formed, for example, of copper opposite to the group of electrode in the bare chip to be electrically connected thereto. A tip end of the respective bump is projected from a surface of the electrode sheet thereof at a predetermined height.

The pressing lid includes a pressing body having a pressing surface to be in contact with a surface opposite to a connecting surface on which the group of electrodes is formed, a lid body for accommodating a base portion of the pressing body, and a plurality of springs arranged in a space between the base of the pressing body and the inner surface of the lid body, for biasing the pressing body to the bare chip as disclosed, for example, in Japanese Patent Application Laid-open No. 2000-3768.

In such a structure, as shown, for example, in FIGS. 27A and 27B, when a pressing lid is arranged on a surface of a bare chip 2 located relative to bumps 4Bi (i=1 to n, n is a positive integer) of an electrode sheet 4 preliminarily disposed on a carrier housing 8 via an elastic sheet 6, the bare chip 2 is initially placed on the electrode sheet 4. The positioning of the electrode section of the bare chip 2 relative to the bumps 4Bi of the electrode sheet 4 is carried out while using, for example, a predetermined image-recognition device. The bumps 4Bi are arranged solely in one row generally at a center of the electrode sheet 4.

Then, when the pressing lid is mounted to the interior of the carrier housing 8, the lid body is mounted on an accommodation portion of the carrier housing 8 so that the outer circumference of the lid body is guided by a guide member provided on the carrier housing 8. Thereafter, tip ends of hook members of the latch mechanism are rotated to be closer to each other and engaged with the upper surfaces of projections of the lid body. As a result, the pressing lid is retained by the carrier housing 8.

At that time, in a case of a so-called center pad type bare chip wherein the plurality of bumps 4Bi are arranged in one row solely generally at a center of the electrode sheet 4 as shown in FIGS. 27A and 27B, the bare chip 2 may incline after it is placed on the bumps 4Bi of the electrode sheet 4, whereby a gap CL may be formed on one side between the electrode surface of the bare chip 2 and the surface of the electrode sheet 4.

Then actually, a predetermined gap is formed between the outer circumference of the carrier housing 8 and the fitting portion of the guide member. In addition thereto, due to the individual variance in biasing force of the above-mentioned respective springs, a pressing surface 10a of a pressing body 10 inclines in one direction as shown in FIG. 27C. That is, the tip ends of the bumps 4Bi are pressed by a deflected pressure caused by the bare chip 2.

Accordingly, there is a risk in that the distribution of the pressures and/or contact areas at tip ends of the plurality of bumps 4Bi may scatter larger while exceeding a tolerance whereby the electric connection of the tip ends of the bump on a part of the bumps 4Bi with the electrodes of the bare chip 2 becomes unreliable.

As shown in Japanese Patent Application Laid-open No. 2004-047186, as a countermeasure to such a trouble, a electrode sheet is proposed, capable of providing dummy bumps adjacent to the vicinity of the bumps on the electrode sheet. Since the tip ends of the dummy bumps are brought into contact with part of the bare chip 2, a moving amount of the bump 4Bi of the bare chip 2 in the height direction is restricted and the posture of the bare chip 2 is stabilized to be approximately parallel to the surface of the electrode sheet without any inclination.

SUMMARY OF THE INVENTION

When the dummy bumps are provided adjacent to the bumps on the electrode sheet as described above, however, there may be a case wherein no area is left on the surface of the bare chip to be in contact with the tip end of the dummy dump if a size of the bare chip is small. Or, there is a case wherein the contact of the tip end of the dummy dump to the surface of the bare chip causes any trouble to the bare chip.

With reference to the above-mentioned problems, the present invention aims to provide a carrier unit for a semiconductor device provided with an electrode sheet and semiconductor socket using the same, capable of uniformly bring an electrode section of a bare chip into contact with bumps of the electrode sheet while pressing the electrode section of a bare chip against the bump at a proper pressure irrespective of sizes of the bare chip.

To achieve the above object, the inventive carrier unit for a semiconductor device comprises an electrode sheet having a bump-forming surface on which bumps to be electrically connected to terminals of the semiconductor device are formed, a posture stabilizing member disposed on the bump-forming surface of the electrode sheet, having an opening through which pass the terminals of the semiconductor device and the bumps, for stabilizing the semiconductor device so that a posture of a connecting surface on which are formed the terminals of the semiconductor device is generally parallel to the bump-forming surface of the electrode sheet, and a housing member having an accommodating portion for accommodating the electrode sheet and the posture stabilizing member.

As apparent from the above description, according to the inventive a carrier unit for a semiconductor device and semiconductor socket using the same, since the posture-stabilizing member is disposed on the bump-forming surface of the electrode sheet and has the opening through which pass the terminals of the semiconductor device and the bumps so that the semiconductor device is stabilized to be generally parallel to the bump-forming surface of the electrode sheet, it is possible to uniformly bring the electrode section of the bare chip into contact with the bumps of the electrode sheet irrespective of sizes of the bare chip and press the both at a proper pressure.

The above and other objects, effects, features and advantages of the present invention will become more apparent from the following description of embodiments thereof taken in conjunction with the accompanying drawings.

DESCRIPTION OF THE PREFERRED EMBODIMENTS

Figure 2:
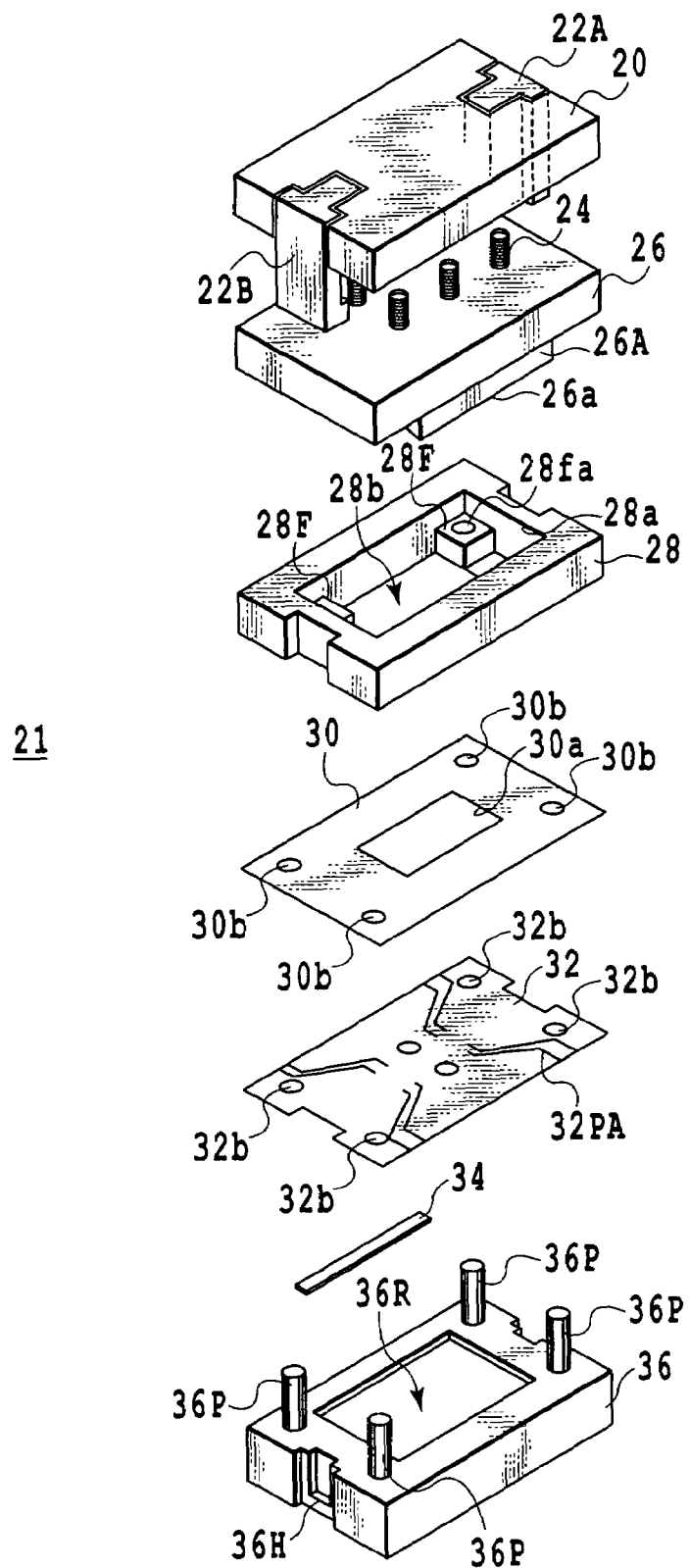
FIG. 2 is an exploded perspective view illustrating a structure of a carrier unit used in an example of the inventive semiconductor device socket.

FIG. 2 illustrates a total structure of a carrier unit used in one embodiment of the semiconductor device socket in accordance with the present invention in an exploded manner.

The embodiment of the inventive semiconductor device socket includes a carrier unit 21 for accommodating a bare chip 38 which is a semiconductor device (see FIG. 7A) therein, and a main body of the IC socket (see FIG. 6) mounting the carrier unit 21 in an accommodating section thereof in a detachable manner.

Figure 6:
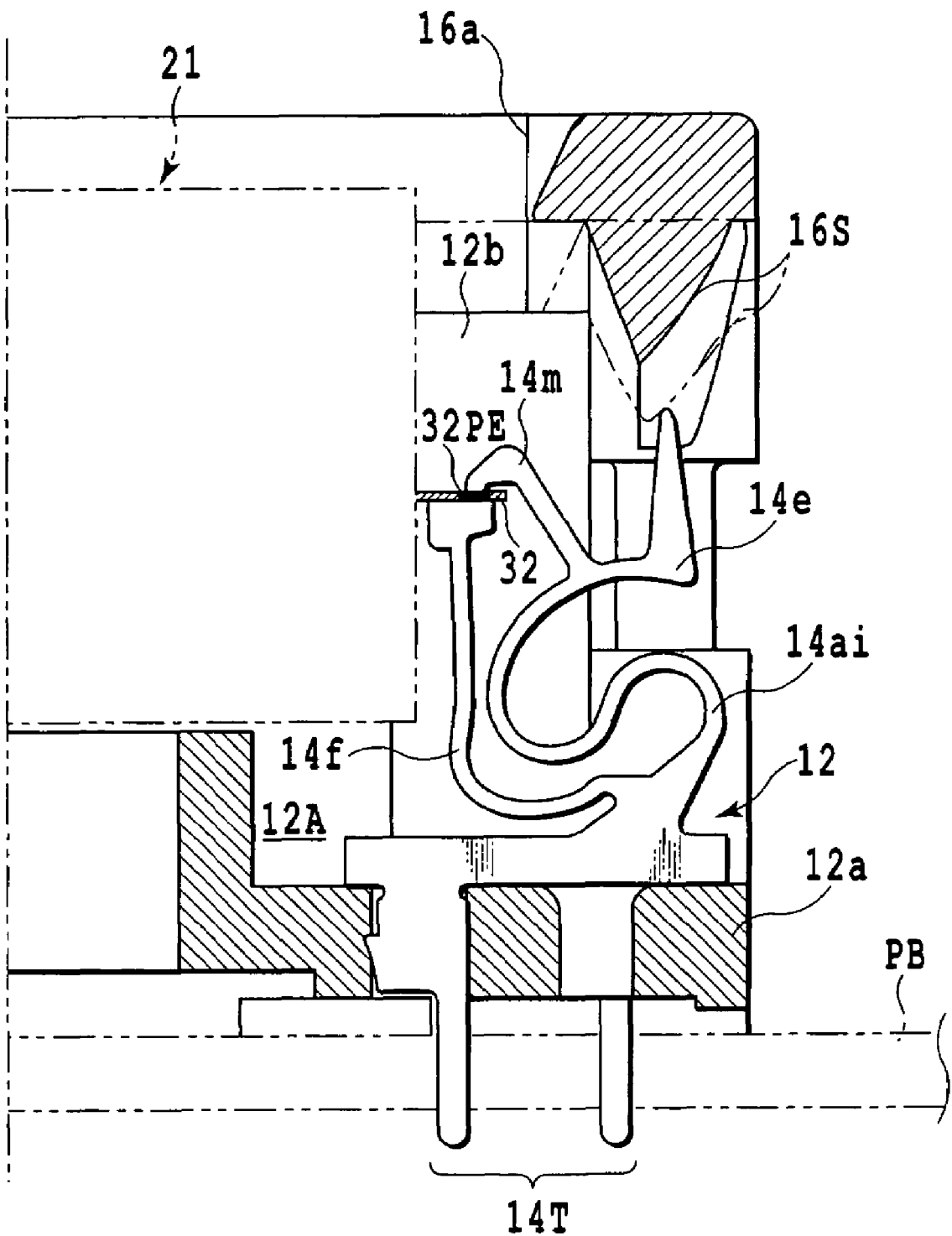
FIG. 6 is a partial sectional view illustrating a structure of a main body of an IC socket in one embodiment of the inventive semiconductor device socket.

As shown in FIG. 6, the main body of the IC socket is disposed on a printed-wiring board PB doing input and output of inspection signals or the like between a bare chip 38 and includes as main elements a main body portion 12 having an accommodating portion for accommodating the carrier unit 21 as a whole, a contact group provided on the main body portion 12, consisting of a plurality of contacts 14$a_i$ to be electrically connected to the respective pads of an electrode sheet described later constituting an element of the carrier unit 21, and a cover member 16 provided to be movable upward and downward relative to the main body portion 12 so that the respective contact sections of the contact group are selectively electrically connected to the respective pads of the electrode sheet 32 as a contact sheet (trade mark).

The main body portion 12 molded with resinous material is disposed at a predetermined position in correspondence to the electrode section of the printed-wiring board PB, as shown in FIG. 6. The main body portion 12 has an accommodating portion 12A for accommodating therein the carrier unit 21. The accommodating portion 12A is defined while being encircled with the inner circumference of a lower base 12a engaged with a lower portion of a lower case 36 of the carrier unit 21 described later and the inner circumference of an upper base 12b continued to the lower base 12a and engaged with an upper portion of the lower case 36. The contact group is supported on the lower base 12a. Slits are formed in the lower base 12a and the upper base 12b, into which are inserted the respective contacts 14*ai* (i=1 to n, n is a positive integer) constituting the contact group.

The respective contact 14*ai* includes a terminal section 14T press-fit into the lower base 12*a*, a fixed-side contact portion 14*f* consecutive to the terminal section 14T and electrically connected to a pad 32PE of the electrode sheet 32 from underside, an elastic movable-side contact portion 14*m*-consecutive to the terminal section 14T and electrically connected to the pad 32PE of the electrode sheet 32 from upper side, and a portion being engaged 14*e* branched from the movable-side contact portion 14*m* to be selectively engaged with a slanted surface of a cover member 16 described later, for rotating the movable-side contact portion 14*m* away from the fixed-side contact portion 14*f*.

The respective contacts 14*ai* are arranged at a pitch in correspondence to the plurality of electrode pads 32PE of the electrode sheet 32 described later in the generally vertical direction to the paper surface. In this regard, FIG. 6 shows part of the contact group encircling the accommodating portion 12A corresponding to one side of four sides.

The cover member 16 molded with resinous material has an opening 16*a* through which passes the carrier unit 21. A frame-like portion forming the peripheral edge of the opening 16*a* is supported to be movable upward and downward by legs guided through a groove provided on the outer circumference of the main body portion 12. Note that the cover member 16 is biased in the direction away from the main body portion 12 by an elastic member not shown. At a lower end of the respective side of the frame-like portion, a slanted surface 16S is formed, which engages with the portion being engaged 14*e* when the cover member 16 is made to descend to a predetermined position as shown in FIG. 6 by a two-dot chain line, and causes the movable-side contact portion 14*m* to move away from the fixed-side contact portion 14*f* against the elastic force thereof.

When the carrier unit 21 described later is mounted to the accommodating portion 12A of the main body portion 12 in the IC socket, the cover member 16 is pressed down by a predetermined amount and retained in this state, whereby after the movable contact portions 14*m* of the contacts 14*ai* are retreated from the accommodating portion 12A, the carrier unit 21 is located in the accommodating portion 12A through the opening 16*a* from above. At that time, the fixed-side contact portion 14*f* touches to the lower surface of the electrode pad 32PE of the electrode sheet 32 in the carrier unit 21.

Subsequently, when the cover member 16 in the held state is released, the cover member 16 rises due to the recovery force of the above-mentioned elastic body and the resultant elastic force of the portion being engaged 14*e* of the contacts 14*ai*. At that time, the respective movable contact portion 14*m* of the contacts 14*ai* returns to the original position to be brought into contact with the upper surface of the electrode pad 32PE of the electrode sheet 32 in the carrier unit 21. Thereby, as shown in FIG. 6, the plurality of electrode pads 32PE in the electrode sheet 32 are electrically connected to a group of contacts.

Figure 4A:
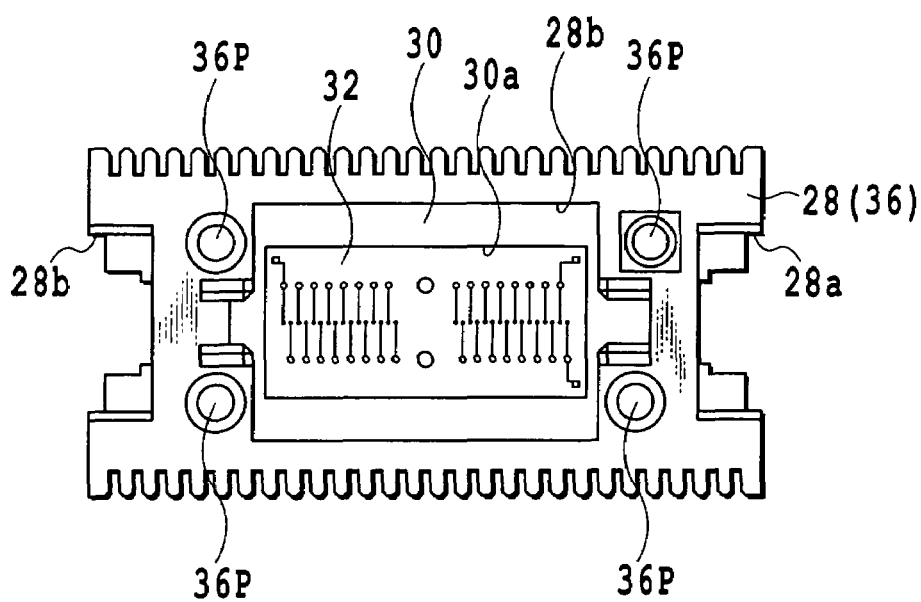
FIG. 4A is a plan view illustrating an upper case in the embodiment shown in FIG. 2 together with the electrode sheet.

On the other hand, as shown in FIG. 2, the carrier unit 21 includes a upper case 28 and a lower case 36 forming the carrier housing having the accommodating portion for accommodating the bare chip not shown, an electrode sheet 32 disposed on the upper end surface of the lower case 36 via the elastic sheet 34 provided on the bottom of a recess in the lower case 36, a posture-stabilizing member 30 for stabilizing the posture of the bare chip disposed and mounted on the electrode sheet 32 so as to become generally parallel to a flat surface of the electrode sheet 32, a pressing cover member 20 including a pressing body 26 for pressing the electrode group of the bare chip onto the bump group 32Bi of the electrode sheet 32 (see FIGS. 1 and 4A), and a latch mechanism for selectively holding the pressing cover member 20 in the lower case 36.

Figure 5:
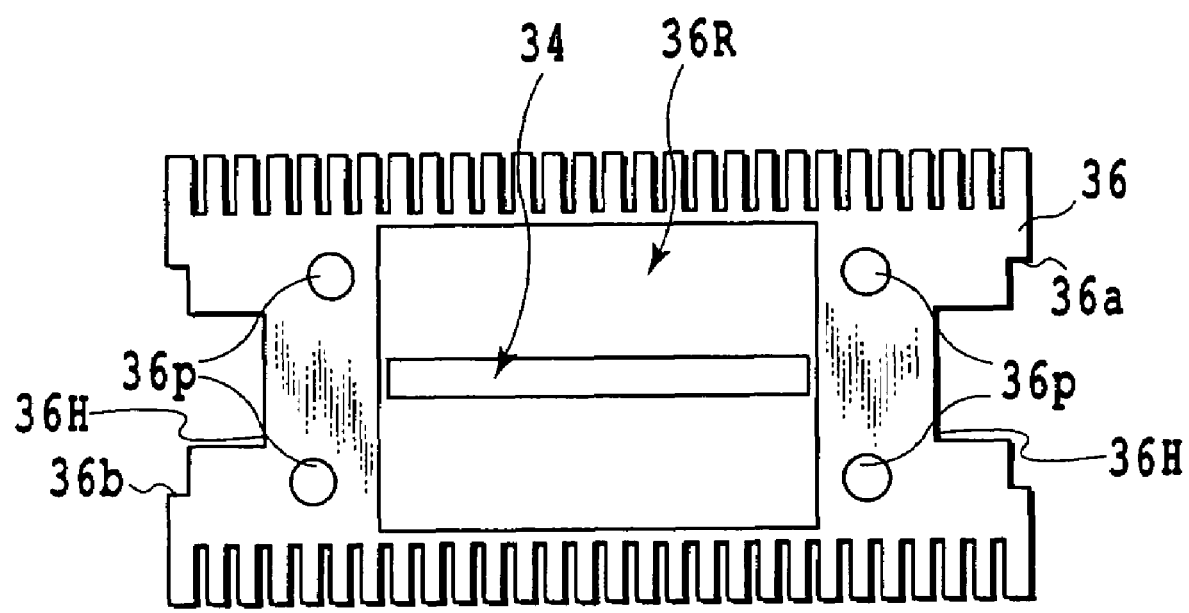
FIG. 5 is a plan view illustrating a lower case in the embodiment shown in FIG. 2.
Figure 7A:
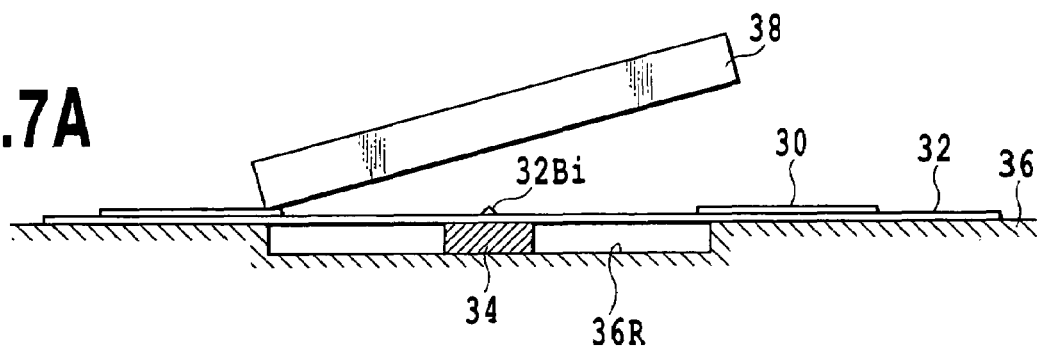
FIGS. 7A, 7B and 7C are views made available for explaining the operation of the embodiment shown in FIG. 2, respectively.

At ends of short sides of the lower case 36 made of resinous material, stepped portions 36H are formed, respectively, to be selectively engaged with tip ends of latches 22A and 22B of the pressing cover member 20 described later when the pressing cover member 20 is mounted on the lower case 36. Generally at a center of the lower case 36, a parallelepiped-shaped recess 36R is formed as shown in FIGS. 2 and 5. In a part of the center area in a bottom wall forming the recess 36R, the elongate band-like elastic sheet 34 is provided. The elastic sheet 34 is made, for example, of a heat-resistant rubber material such as silicon rubber and located opposite to the bump group 32Bi in the electrode sheet described later as shown in FIG. 7A. Thereby, the variance in height of the respective bump forming the bump group 32Bi is absorbed to stabilize the contact of the bumps to the electrode section. Also, as shown in FIG. 2, in the periphery of an opening end of the recess 36R on the upper surface thereof, four coupling pins 36P are formed integral with the periphery as shown in FIG. 2.

On the upper surface of the lower case 36, the upper case 28 made of resinous material is fixed by the welding via the electrode sheet 32 described later and the posture-stabilizing member 30.

At ends of short sides of the upper case 28, notches are formed in correspondence to the stepped portions 36H in the lower case 36. In a central area of the upper case 28, a rectangle opening 28*b* is formed opposite to the opening 36R of the lower case 36. At the respective corners of the inner wall forming the opening 28*b*, coupling portions 28F having holes 28*fa*, into which are inserted the coupling pins 36P of the lower case 36, are formed integral with the inner wall thereof. An end of the coupling pin 36P inserted into the hole 28*fa* is, for example, welded.

On the inner circumference of the pressing cover member 20, there are a pressing body 26 having a pressing surface 26*a* touching the upper surface of the bare chip, and a plurality of springs 24 disposed in a space between a recess in base of the pressing body 26 and the inner periphery surface of the pressing cover member 20, for biasing the pressing body 26 toward the bare chip.

Figure 3:
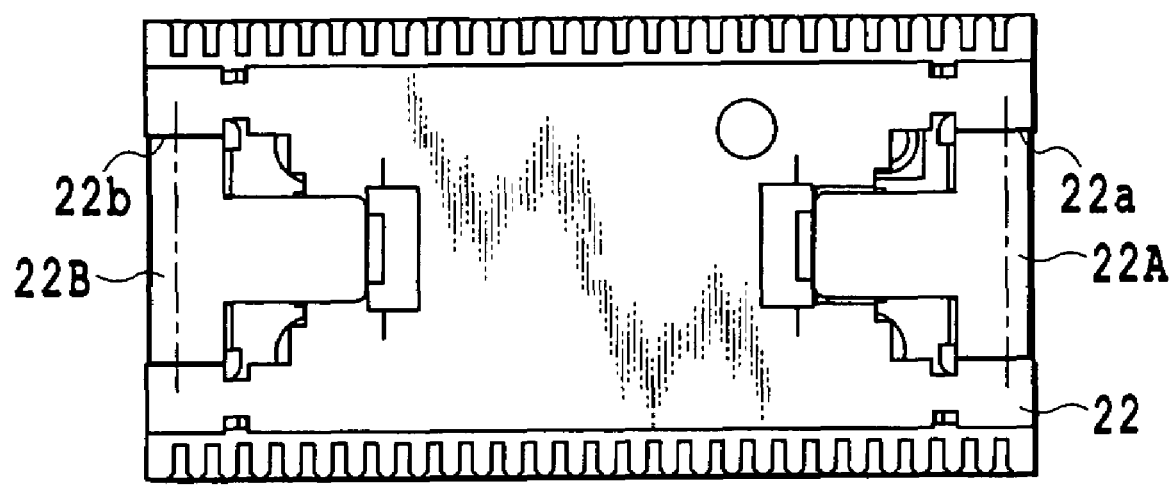
FIG. 3 is a top view of the embodiment shown in FIG. 2.

At ends of short sides of the pressing cover member 20, latches 22A and 22B constituting part of the latch mechanism are provided in a rotatable manner as shown in FIG. 3. Tip ends of the latches 22A and 22B are selectively engaged with the stepped portions 36H in the lower case 36 described above. Note that the tip ends of the latches 22A and 22B are biased by biasing means not shown in the direction to be engaged with the stepped portions 36H in the lower case 36.

In a convex portion 26A of the pressing body 26, a flat pressing surface 26*a* is formed for pressing the upper surface of the bare chip. A base of the pressing body 26 is movably inserted into the inner circumference of the pressing cover member 20 along the pressing direction via the plurality of springs 24.

A bare chip 38 of a generally square shape shown in FIG. 7A is for example, of a center pad type in which there is solely one row of a predetermined electrode group in a center of a lower surface opposite to the bumps 32Bi of the electrode sheet 32.

Figure 1:
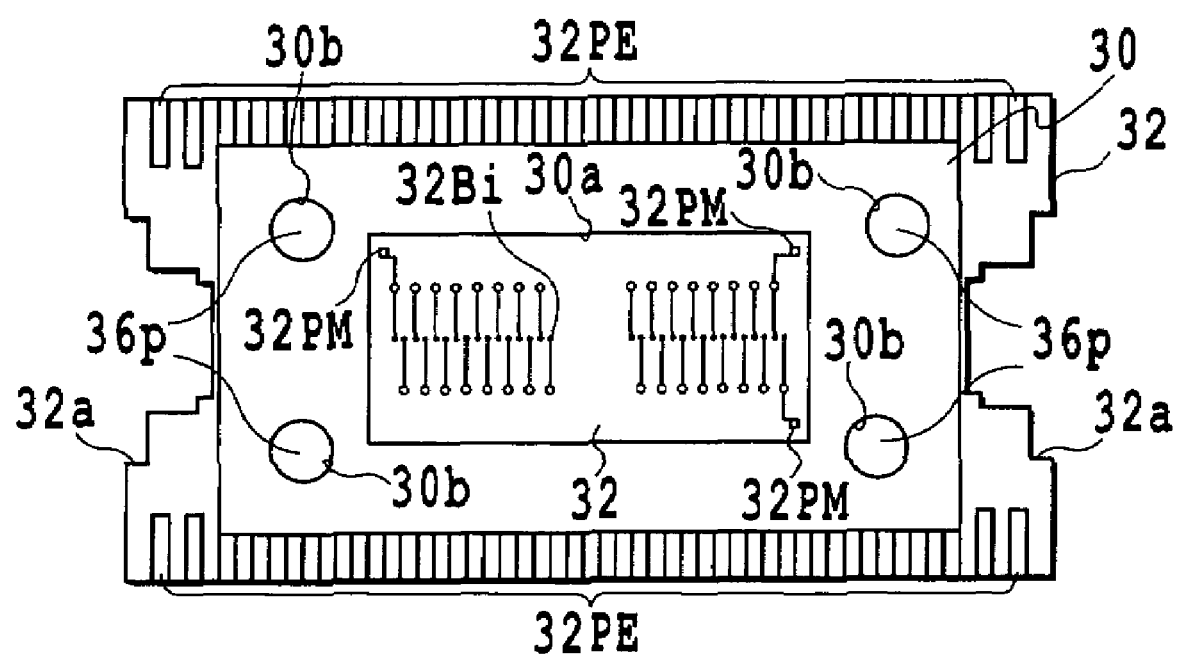
FIG. 1 is a plan view of a first embodiment of an electrode sheet and a posture stabilizing member used in an example of semiconductor device socket according to the present invention.

As schematically shown in FIG. 1 in an partially enlarged manner as a first embodiment of the present invention, the electrode sheet 32 has a bump-forming surface in which a plurality of bumps 32Bi (i=1 to n, n is a positive integer) are arranged in one row in correspondence to the electrode group in the bare chip 38 to be electrically connected thereto in a center of a substrate. For example, a root of the respective bump 32Bi made of copper or others has a diameter of approximately 100 μm and a height of approximately 50 μm projected from the surface of the substrate. The substrate thereof is made, for example, of polyimide resin to be a thin plate having a thickness of approximately several tens of micrometers. The respective bump 32Bi in the electrode sheet 32 is connected to an electrode pad 32PE formed at each of opposite ends thereof via a predetermined printed circuit 32PA (see FIG. 2). These electrode pads 32PE are electrically connected to the contact group in the main body portion 12 described above. As shown in FIG. 2, at four positions in the periphery of the bumps 32Bi, through-holes 32b are formed so that the coupling pins 36P are inserted therethrough. Further, at ends of short sides in the electrode sheet 32, there are cut-out portion 32a into which are inserted the latches 22A and 22B, respectively.

In the periphery of the respective bumps 32Bi located in the vicinity of opposite ends of the arrangement of the bumps 32Bi, marks 32PM for positioning the electrode section of the bare chip 38 relative to the bumps 32Bi of the electrode sheet 32 are located at three positions in the same plane as the bumps 32Bi as shown in FIG. 1. For example, the marks 32PM are used when the electrode section of the bare chip 38 is positioned to the bumps 32Bi of the electrode sheet 32 while using the image recognition technique. Also in the bare chip 38, positioning marks not shown are provided in correspondence to the marks 32PM.

Figure 4B:
FIG. 4B is a side view of the embodiment shown in FIG. 1.

As shown in FIG. 4B, the posture-stabilizing member 30 placed on the electrode sheet 32 is made, for example, of polyimide resin to be a thin plate having a thickness somewhat smaller than the height of the bump 32Bi. In a first embodiment, the posture-stabilizing member 30 has a generally rectangle opening 30a as shown in FIG. 1. The opening 30a is formed opposite to the bumps 32Bi and the marks 32PM. On the periphery of the opening 30a, there are holes 30b through which pass the coupling pins 36.

Figure 7B:
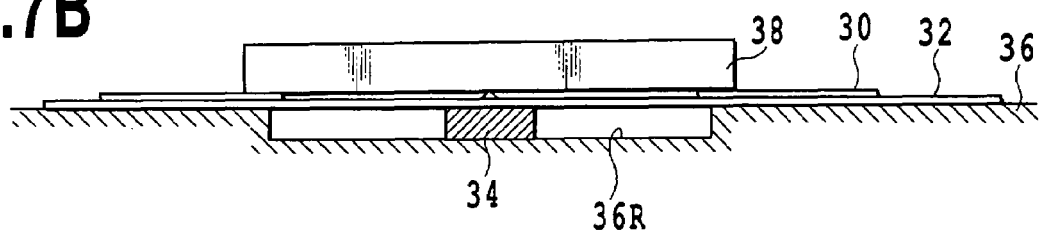

In such a structure, upon mounting the bare chip 38 within the carrier unit, the above-mentioned marks 32PM and the image recognition technique are used so that the electrode group of the bare chip 38 held by a conveying/holding means such as a vacuum type tweezers is positioned to the bumps 32Bi of the electrode sheet 32 as shown in FIG. 7A, and thereafter, the electrode group of the bare chip 38 are arranged to be brought into contact with the bumps 32Bi as shown in FIG. 7B. At this time, a relatively narrow portion of the electrode surface on the bare chip 38 touches to the periphery of the opening 30a in the posture-stabilizing member 30 and is placed there. Thereby, the bare chip 38 is arranged generally parallel to the bump-forming surface of the electrode sheet 32 on which the bumps 32Bi are formed, without the inclination of the electrode surface in the electrode sheet 32. At that time, the reduction of the contact pressure of the bumps 32Bi to the electrode surface of the bare chip 38 is avoidable.

Figure 7C:
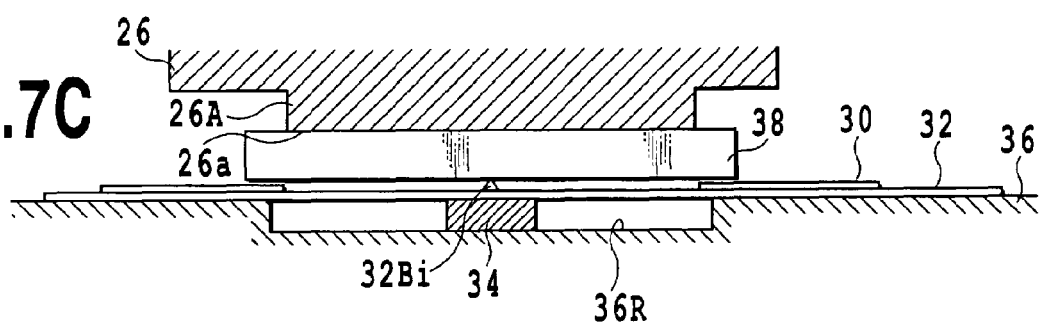

Then, the pressing cover member 20 and the pressing body 26 are coupled to the upper case 28 and the lower case 36 via the latches 22A and 22B. At this time, the convex portion 26A of the pressing body 26 is disposed in the upper case 28 coupled to the lower case 36 as shown in FIG. 7C, and the pressing surface 26a thereof is pushed onto the upper surface of the bare chip 38 against a biasing force of the springs 24, after which the pressing cover member 20 or others is coupled to the lower case 36.

After the attached carrier unit has been mounted to the accommodating portion of the IC socket as described above, a predetermined test is carried out.

Figure 18:
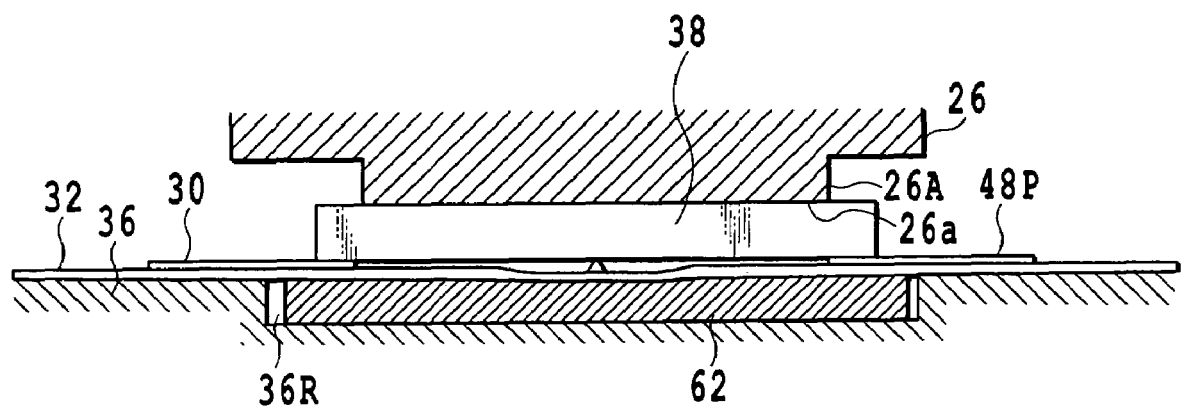
FIG. 18 is a partial sectional view illustrating a modification of the embodiment shown in FIG. 2.
Figure 19:
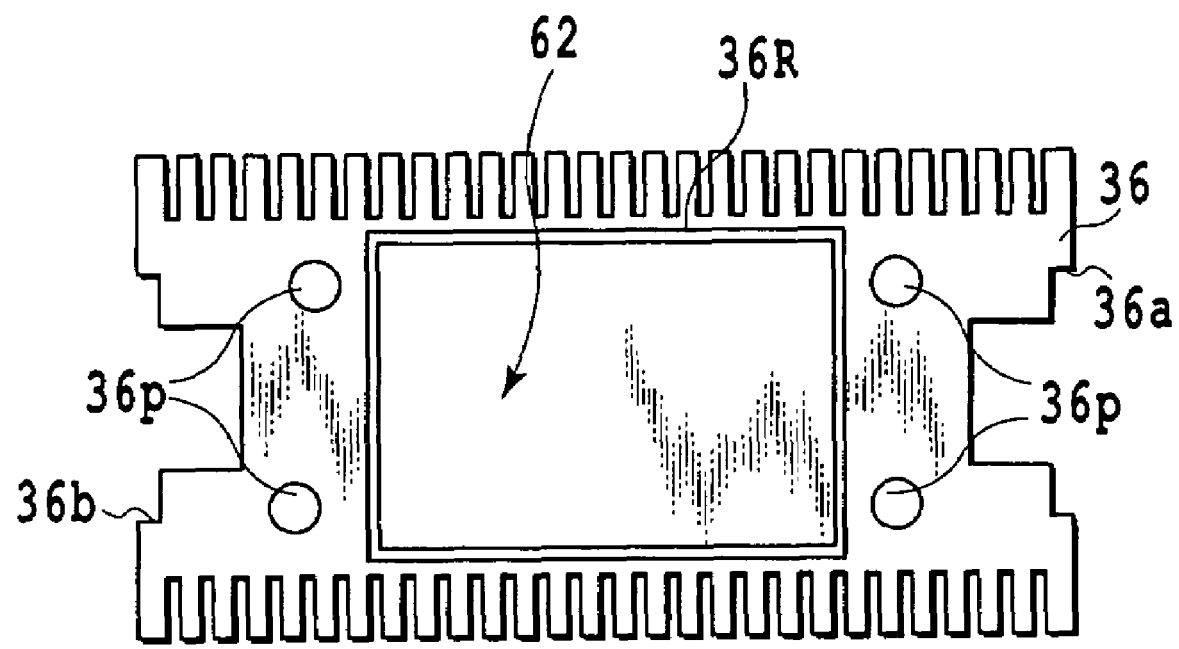
FIG. 19 is a plan view illustrating a lower case in the embodiment shown in FIG. 18.

In this regard, while a band-like elastic sheet 34 is provided solely on part of the bottom of the recess 36R of the lower case 36 in the above embodiment, it is not limited to this example, but e.g. the elastic sheet 62 may be disposed all over the bottom of the recess 36R as shown in FIGS. 18 and 19. In FIGS. 18 and 19, the same reference numerals are used for denoting the same or similar components of the example shown in FIGS. 7A to 7C and the duplication explanation thereof will be eliminated.

Figure 8:
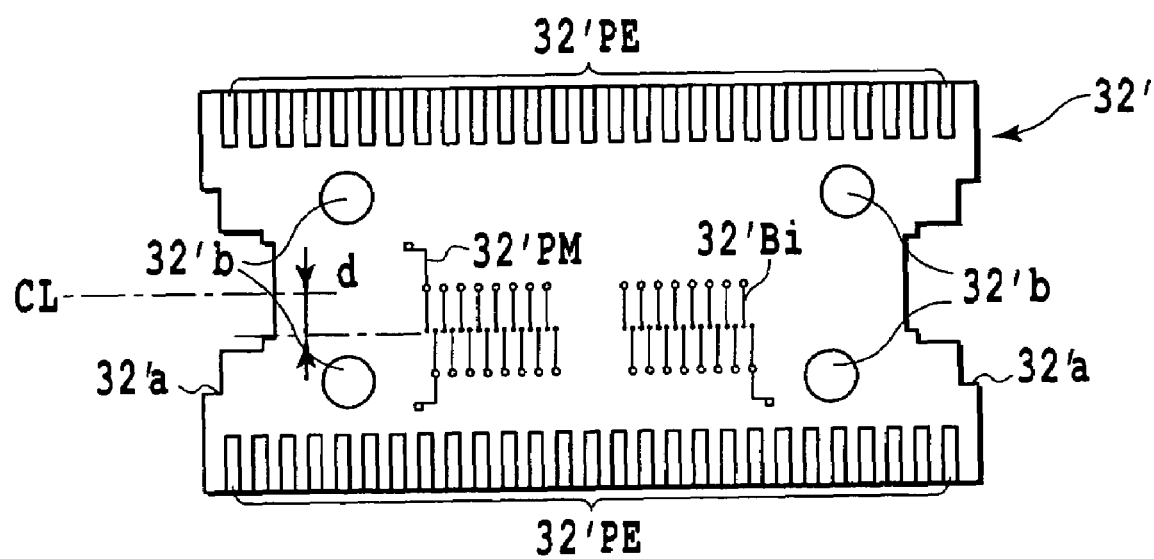
FIG. 8 is a plan view of a first modification of the electrode sheet used in the embodiment shown in FIG. 1.

In the above embodiment, while the electrode sheet 32 has the bump-forming surface on which the plurality of bumps 32Bi are arranged in one row generally at a center of the substrate in correspondence to the electrode group of the bare chip 38 to be electrically connected thereto, the arrangement of the bumps 32Bi is not limited thereto. For example, as shown in FIG. 8, the electrode sheet 32' may have the bump-forming surface on which the bumps 32'Bi (i=1 to n, n is a positive integer) are formed in one row in correspondence to the electrode group of various bare chips at a position deflected relative to a center line CL of the electrode sheet 32' in one direction by a predetermined amount d.

In the above-mentioned electrode sheet 32' as a first modification of the electrode sheet, a root of the respective bump 32', for example, made of copper or others has a diameter of approximately 100 μm and a height of approximately 50 μm projected from the surface of a substrate thereof. The substrate is made, for example, of polyimide resin as a thin plate having a thickness of approximately several tens of micrometers. The respective bump 32Bi in the electrode sheet 32' is connected to electrode pads 32'PE formed at opposite ends via a predetermined printed circuit. These electrode pads 32'PE are electrically connected to the contact group in the main body portion 12 described above. At four positions around the bumps 32'Bi, through-holes 32'b through which pass coupling pins 36P are respectively formed. Further, at ends of short sides in the electrode sheet 32', notches 32'a in which the latches 22A and 22B are inserted are formed.

On the periphery of the bumps 32'B1 located in the vicinity of the opposite ends of the arrangement of the bumps 32'Bi, marks 32'PM for positioning the electrode section of the bare chip 38 relative to the bumps 32'Bi in the electrode sheet 32' are provided at three positions on the same plane as that of the bumps 32'Bi. The marks 32'PM are used, for example, when the electrode section of the bare chip 38 is positioned to the bumps 32'Bi of the electrode sheet 32' by using the image recognition technique.

Figure 20:
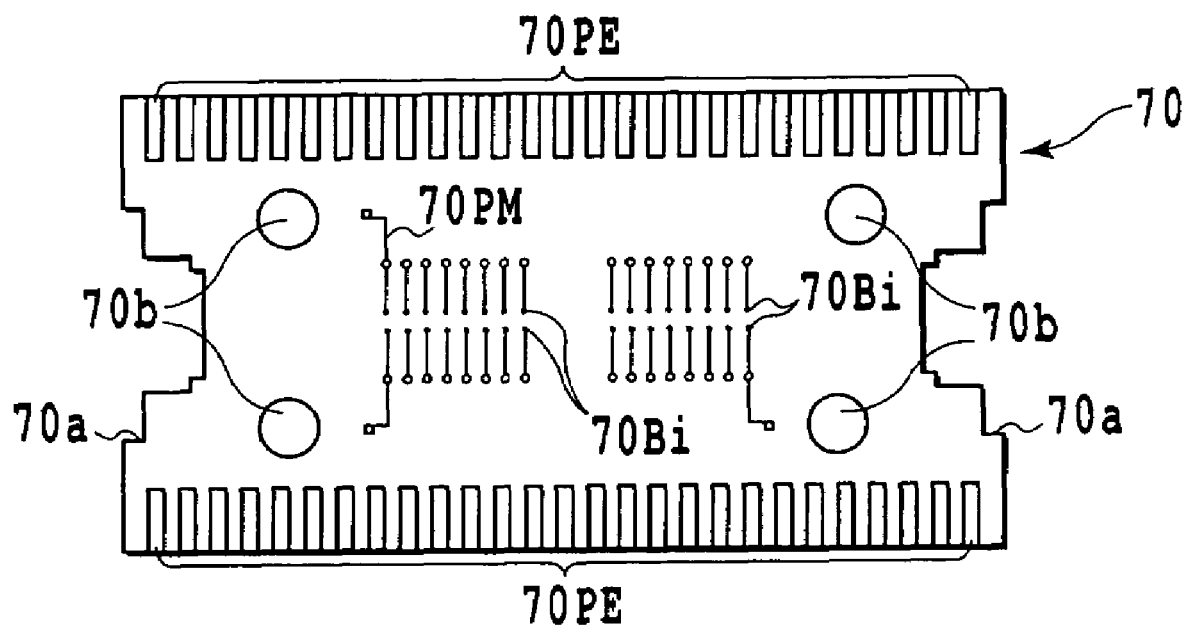
FIG. 20 is a plan view illustrating a second modification of the electrode sheet used in the embodiment shown in FIG. 1.

Subsequently, FIG. 20 illustrates a second modification of the electrode sheet.

While each of the electrode sheets shown in the above-mentioned FIGS. 1 and 8 has the bump-forming surface on which a plurality of bumps are formed in one row generally at a center of the substrate, the modification shown in FIG. 20, a plurality of bumps 70Bi (i=1 to n, n is a positive integer) are arranged in two parallel rows on a bump-forming surface of a electrode sheet 70.

In the electrode sheet 70 shown in FIG. 20, a root of the bump 70Bi made, for example, of copper or others has a diameter of approximately 100 μm and a height of approximately 50 μm projected from a surface of the substrate. The substrate is made of polyimide to be a thin plate having a thickness of approximately several tens of micrometers. The bumps 70Bi on the electrode sheet 70 are connected to electrode pads 70PE formed on opposite sides extending in the longitudinal direction via predetermined printed circuits.

These electrode pads 70E are electrically connected to the contact group in the above-mentioned main body portion 12. At four positions around the group of bumps 70Bi, through-holes 70b through which pass coupling pins 70, respectively, are formed. Further, at opposite ends on short sides of the electrode sheet 70, there are cut-out portions 70a into which inserted the latches 22A and 22B.

On the periphery of the bumps 70Bi located in the vicinity of opposite ends of the arrangement of the bumps 70Bi, marks 70PM for positioning the electrode section of the bare chip 38 to the bumps 80Bi in the electrode sheet 70 are provided at three positions in the same plane as that of the bumps 70Bi. The marks 70PM are used when the electrode section of the bare chip 38 is located to the bumps 70Bi of the electrode sheet 70 by using the image recognition technique.

Figure 21:
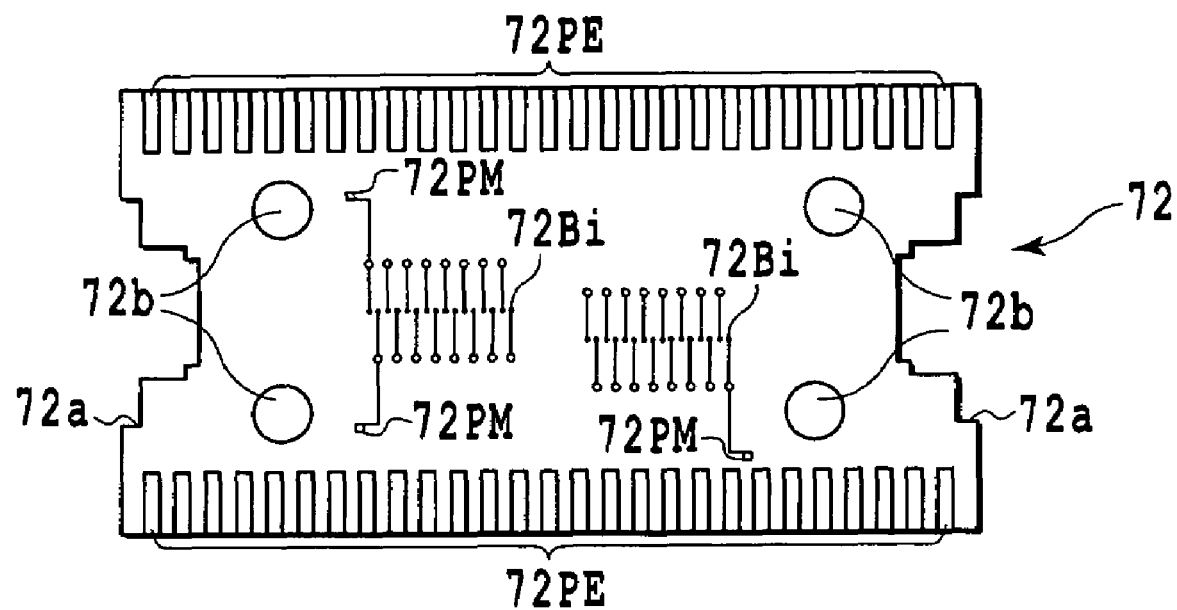
FIG. 21 is a plan view illustrating a third modification of the electrode sheet used in the embodiment shown in FIG. 1.

FIG. 21 illustrates a third modification of the electrode sheet.

While the plurality of bumps 70Bi in the modification shown in FIG. 20 are arranged in two parallel rows to be opposite to each other generally at a center of the electrode sheet 70, in the modification shown in FIG. 21, the bumps 72Bi (i=1 to n, n is a positive integer) are arranged generally at a center in two rows in a staggered manner. That is, the bumps 72Bi in the respective row extend from a position in the vicinity of the end of the short side of the electrode sheet 72 to generally at a center thereof.

In the electrode sheet 72 shown in FIG. 21, a root of the bump 72Bi made, for example, of copper or others has a diameter of approximately 100 μm and a height of approximately 50 μm projected from the surface of the substrate thereof. The substrate is made, for example, of polyimide to be a thin plate having a thickness of approximately several tens of micrometers. The respective bumps 72Bi in the electrode sheet 72 are connected to electrode pads 72PE formed on opposite longitudinal sides via predetermined printed circuits. These electrode pads 72PE are electrically connected to the contact group in the main body portion 12 described before. At four positions around the bumps 72Bi, through-holes 72b through which pass coupling pins 36P are formed. Further, at opposite ends of short sides in the electrode sheet 72, cut-out portions 72a into which are inserted latches 22A and 22B are formed.

On the periphery of the bumps 72Bi located in the vicinity of ends of the arrangement of the bumps 72Bi, marks 72PM for positioning the electrode section in the bare chip 38 to the bumps 73Bi in the electrode sheet 72 are provided at three positions in the same plane as that of the bumps 73Bi. The marks 72PM are used when the positioning of the electrode section of the bare chip 38 to the bumps 73Bi of the electrode sheet 72 is carried out by using the image recognition technique.

Figure 22:
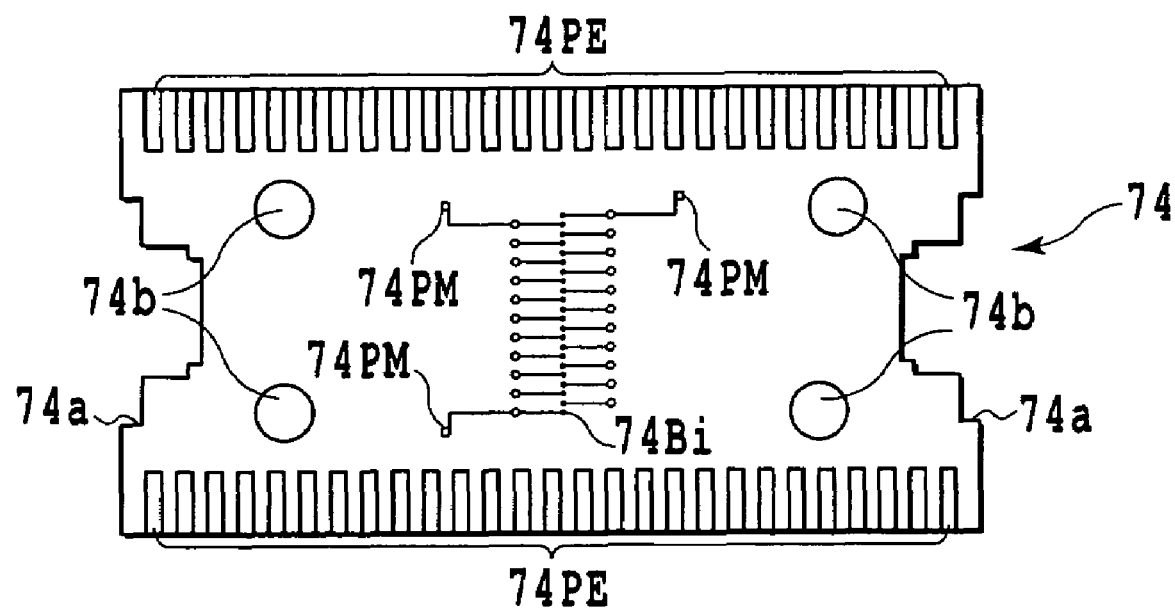
FIG. 22 is a plan view illustrating a fourth modification of the electrode sheet used in the embodiment shown in FIG. 1.

FIG. 22 illustrates a fourth modification of the electrode sheet.

While the electrode sheet shown in FIG. 1 described before has a bump-forming surface on which are formed a plurality of bumps in one row along a long side generally at a center of the substrate, in the modification shown in FIG. 22, a plurality of bumps 74Bi (i=1 to n, n is a positive integer) are formed generally at a center of an electrode sheet 74 along a short side.

In FIG. 22, a root of the bump 74Bi made, for example, of copper or others has a diameter of approximately 100 μm and a height of approximately 50 μm projected from a surface of a substrate of the electrode sheet 74. The substrate is made, for example, of polyimide resin to be a thin plate having several tens of micrometers. The respective bumps 74Bi in the electrode sheet 74 are connected to electrode pads 74PE formed at longitudinal opposite sides via predetermined printed circuits. These electrode pads 74PE are electrically connected to the contact group in the main body portion 12 described before. At four positions around the bumps 74Bi, through-holes 74b through which pass coupling pins 36P are formed. Further, at opposite ends of short sides in the electrode sheet 74, cut-out portions 74a into which are inserted latches 22A and 22B are formed.

On the periphery of the bumps 74Bi located in the vicinity of ends of the arrangement of the bumps 74Bi, marks 74PM for positioning the electrode section in the bare chip 38 to the bumps 74Bi in the electrode sheet 74 are provided at three positions in the same plane as that of the bumps 74Bi. The marks 74PM are used when the positioning of the electrode section of the bare chip 38 to the bumps 74Bi of the electrode sheet 74 is carried out by using the image recognition technique.

Figure 23:
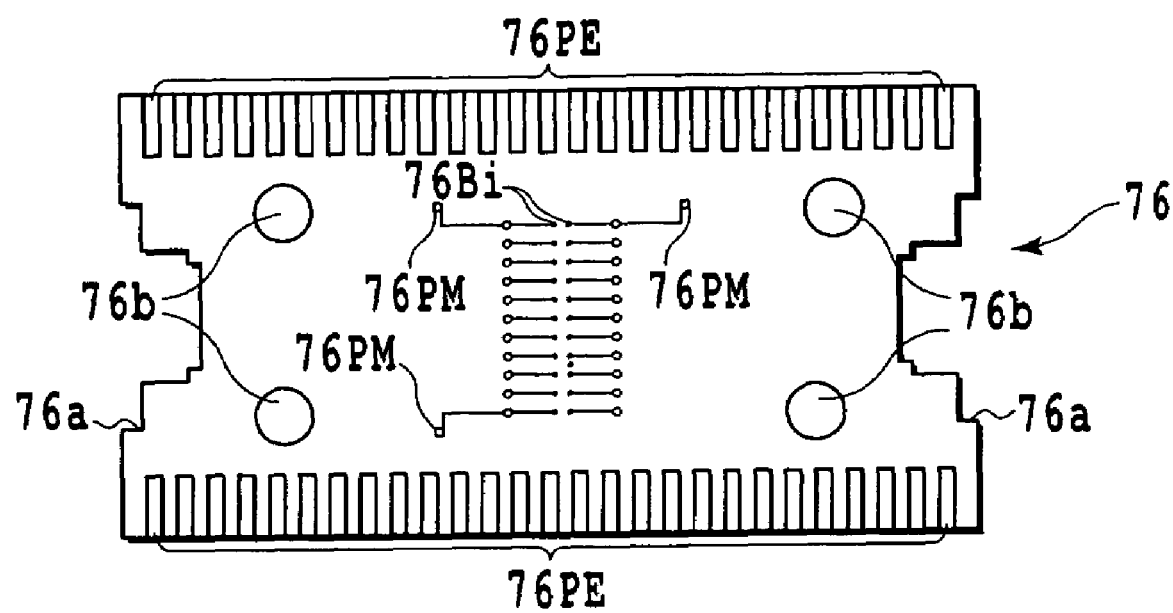
FIG. 23 is a plan view illustrating a fifth modification of the electrode sheet used in the embodiment shown in FIG. 1.

FIG. 23 illustrates a fifth modification of the electrode sheet.

While the electrode sheet shown in FIG. 22 described before has a bump-forming surface on which are formed a plurality of bumps in two row along a short side generally at a center of the substrate, in the modification shown in FIG. 23, a plurality of bumps 76Bi (i=1 to n, n is a positive integer) are formed in two rows parallel to each other generally at a center of an electrode sheet 76 along a short side.

In FIG. 23, a root of the bump 76Bi made, for example, of copper or others has a diameter of approximately 100 μm and a height of approximately 50 μm projected from a surface of a substrate of the electrode sheet 76. The substrate is made, for example, of polyimide resin to be a thin plate having several tens of micrometers. The respective bumps 76Bi in the electrode sheet 76 are connected to electrode pads 74PE formed at longitudinal opposite sides via predetermined printed circuits. These electrode pads 76PE are electrically connected to the contact group in the main body portion 12 described before. At four positions around the bumps 76Bi, through-holes 76b through which pass coupling pins 36P are formed. Further, at opposite ends of short sides in the electrode sheet 76, cut-out portions 76a into which are inserted latches 22A and 22B are formed.

On the periphery of the bumps 76Bi located in the vicinity of ends of the arrangement of the bumps 76Bi, marks 76PM for positioning the electrode section in the bare chip 38 to the bumps 76Bi in the electrode sheet 76 are provided at three positions in the same plane as that of the bumps 76Bi. The marks 76PM are used when the positioning of the electrode section of the bare chip 38 to the bumps 76Bi of the electrode sheet 76 is carried out by using the image recognition technique.

Figure 24:
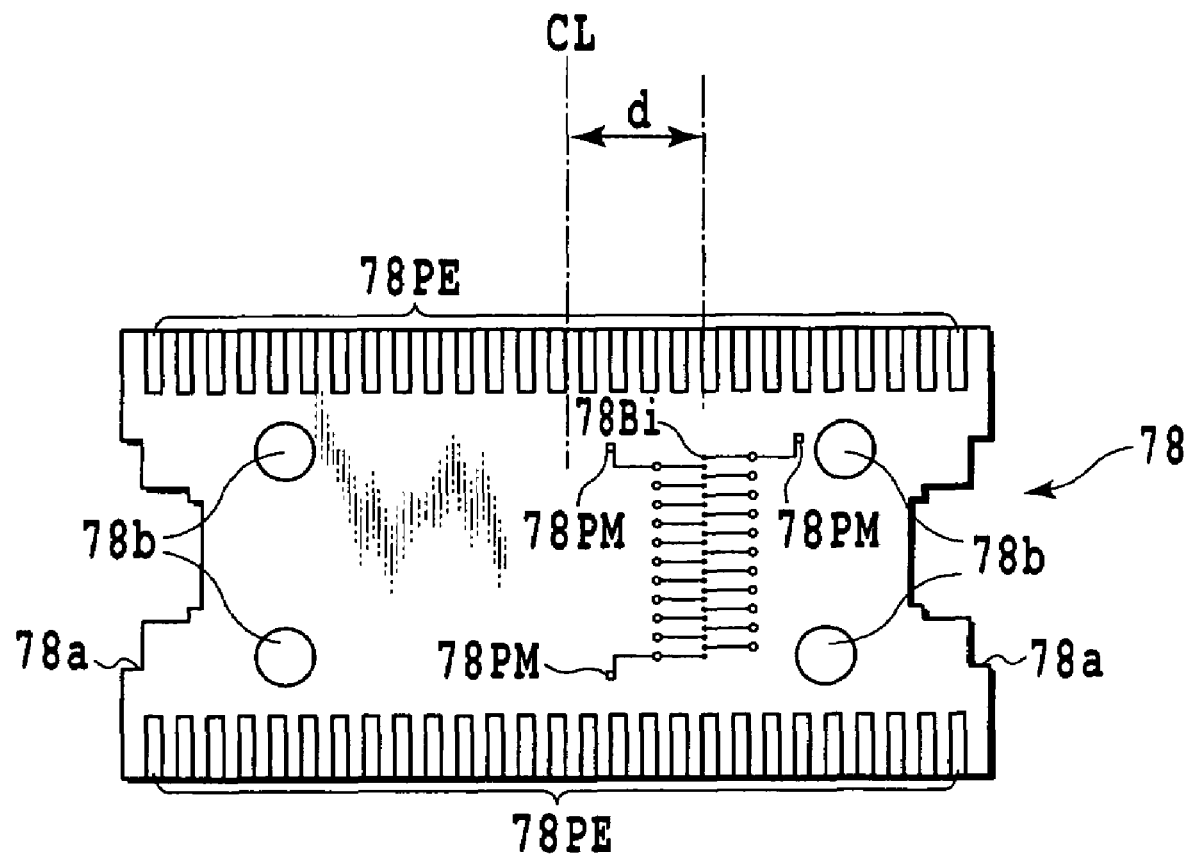
FIG. 24 is a plan view illustrating a sixth modification of the electrode sheet used in the embodiment shown in FIG. 1.

FIG. 24 illustrates a sixth modification of the electrode sheet.

While the electrode sheet 74 shown in FIG. 22 described before has a bump-forming surface on which are formed a plurality of bumps in two row along a short side generally at a center of the substrate, in the modification shown in FIG. 24, bumps 78Bi (i=1 to n, n is a positive integer) are formed in one row at a position deviated right side from a center line CL of an electrode sheet 78 thereof by a predetermined amount d.

In FIG. 24, a root of the bump 78Bi made, for example, of copper or others has a diameter of approximately 100 μm and a height of approximately 50 μm projected from a surface of a substrate of the electrode sheet 78. The substrate is made, for example, of polyimide resin to be a thin plate having several tens of micrometers. The respective bumps 78Bi in the electrode sheet 78 are connected to electrode pads 78PE formed at longitudinal opposite sides via predetermined printed circuits. These electrode pads 78PE are electrically connected to the contact group in the main body portion 12 described before. At four positions around the bumps 78Bi, through-holes 78b through which pass coupling pins 36P are formed. Further, at opposite ends of short sides in the electrode sheet 78, cut-out portions 78a into which are inserted latches 22A and 22B are formed.

On the periphery of the bumps 76Bi located in the vicinity of ends of the arrangement of the bumps 78Bi, marks 786PM for positioning the electrode section in the bare chip 38 to the bumps 78Bi in the electrode sheet 78 are provided at three positions in the same plane as that of the bumps 78Bi. The marks 78PM are used when the positioning of the electrode section of the bare chip 38 to the bumps 78Bi of the electrode sheet 78 is carried out by using the image recognition technique.

Figure 25:
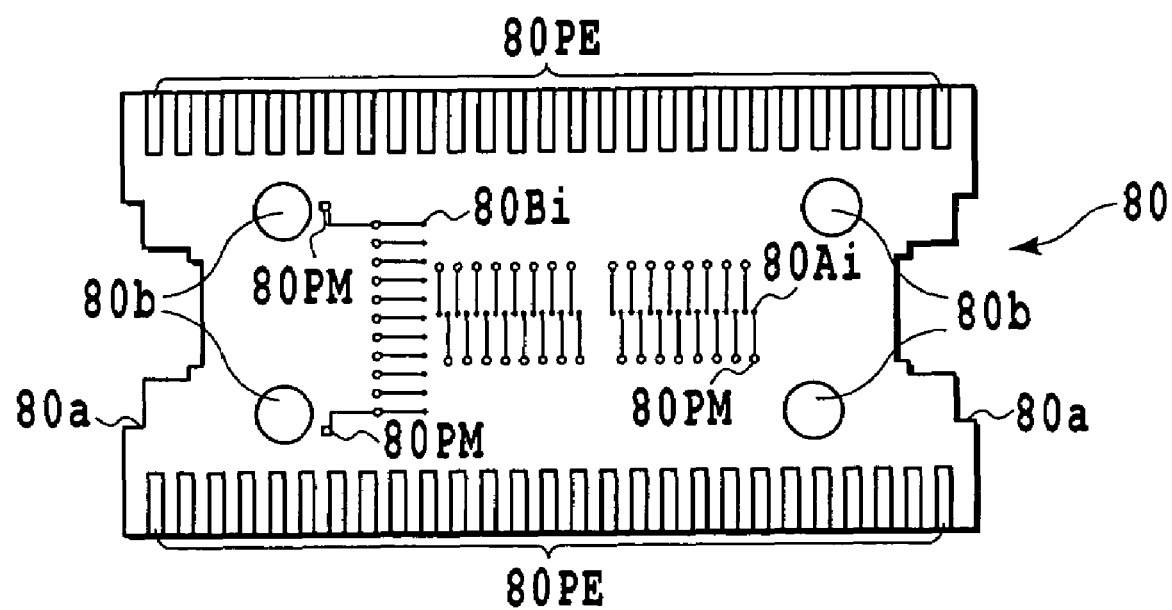
FIG. 25 is a plan view illustrating a seventh modification of the electrode sheet used in the embodiment shown in FIG. 1.

FIG. 25 illustrates a seventh modification of the electrode sheet.

While the electrode sheet 32 shown in FIG. 1 has a bump-forming surface on which are formed a plurality of bumps 32Bi in one row generally at a center of the substrate in correspondence to the arrangement of the electrode group in the bare chip 38 to be electrically connected thereto, in the modification shown in FIG. 25, bumps 80Ai (i=1 to n, n is a positive integer) arranged in one row generally at a center and bumps 80Bi (i=1 to n, n is a positive integer) arranged along a short side generally vertically to the former are combined to form a T-shape on an electrode sheet 80.

In FIG. 25, a root of the bump 80Ai, 80Bi made, for example, of copper or others has a diameter of approximately 100 μm and a height of approximately 50 μm projected from a surface of a substrate of the electrode sheet 80. The substrate is made, for example, of polyimide resin to be a thin plate having several tens of micrometers. The respective bumps 8OAi and 8OBi in the electrode sheet 80 are connected to electrode pads 8OPE formed at longitudinal opposite sides via predetermined printed circuits. These electrode pads 80PE are electrically connected to the contact group in the main body portion 12 described before. At four positions around the bumps 8OAi and 8OBi, through-holes 80b through which pass coupling pins 36P are formed. Further, at opposite ends of short sides in the electrode sheet 80, cut-out portions 80a into which are inserted latches 22A and 22B are formed.

On the periphery of the bumps 80Bi located in the vicinity of ends of the arrangement of the bumps 80Bi, marks 80PM for positioning the electrode section in the bare chip 38 to the bumps 80Bi in the electrode sheet 80 are provided at two positions in the same plane as that of the bumps 80Ai. Also, a mark 80PM for positioning the electrode section in the bare chip 38 to the bumps 80Ai in the electrode sheet 80 is provided at one position in the same plane as that of the bumps 80Ai. The marks 80PM are used when the positioning of the electrode section of the bare chip 38 to the bumps 80Ai and 80Bi of the electrode sheet 80 is carried out by using the image recognition technique.

Figure 26:
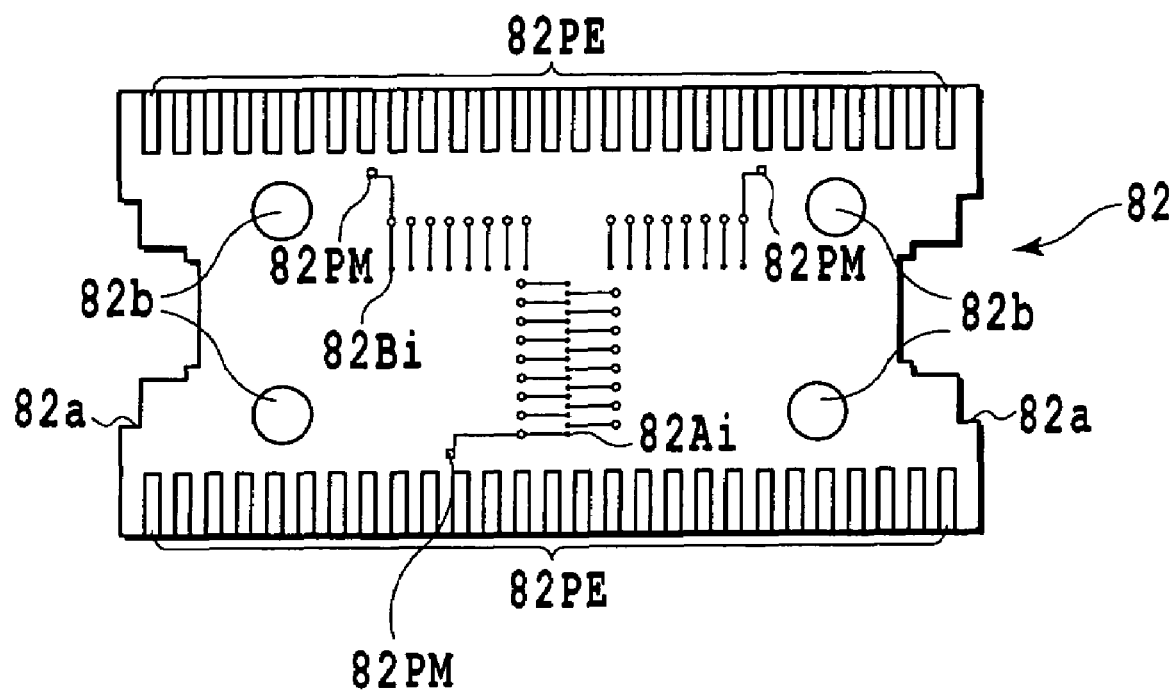
FIG. 26 is a plan view illustrating a eighth modification of the electrode sheet used in the embodiment shown in FIG. 1.
Figure 27A:
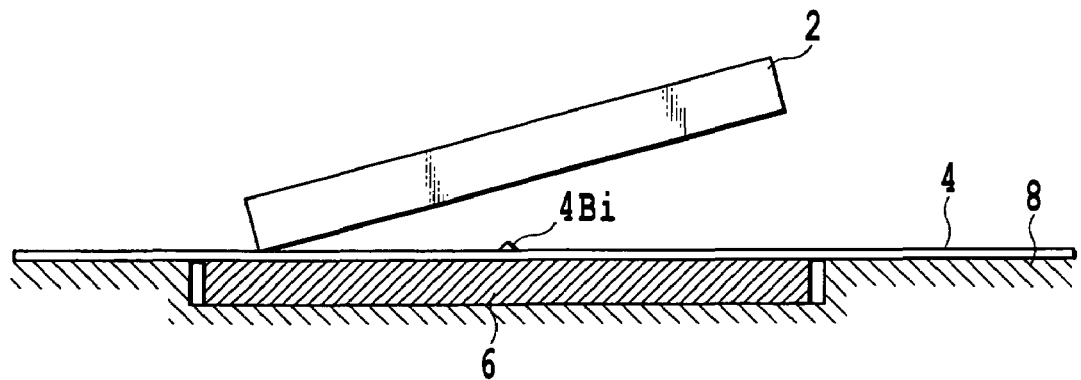
FIGS. 27A, 27B and 27C are partial sectional views, respectively, made available for illustrating the steps for mounting the bare chip in the prior art carrier unit.
Figure 27B:
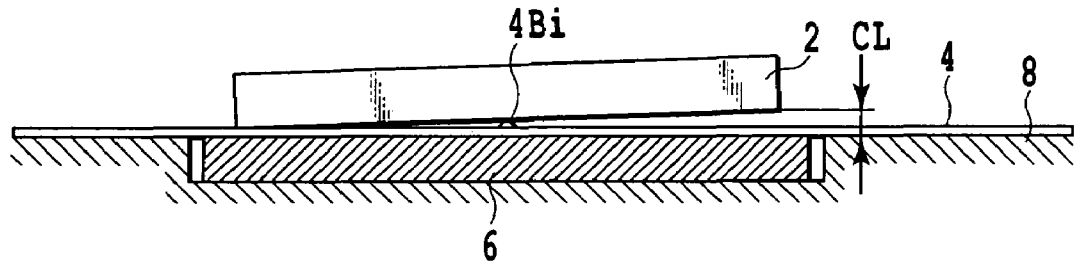
Figure 27C:
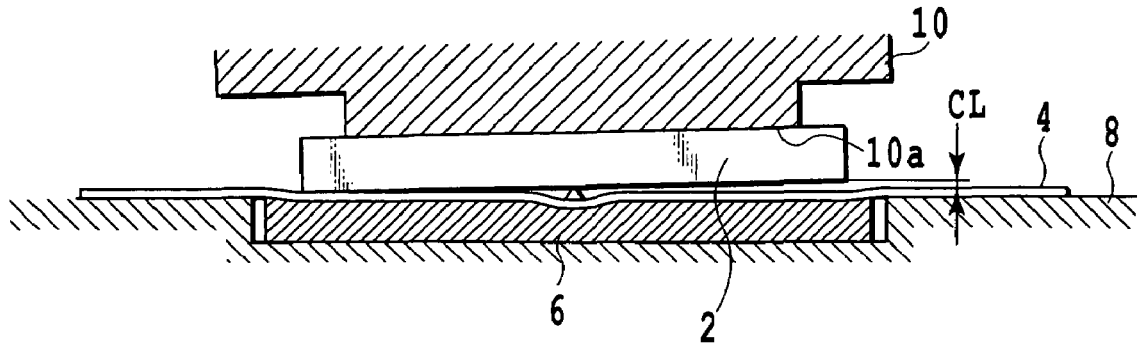

FIG. 26 illustrates an eighth modification of the electrode sheet.

While the electrode sheet 74 shown in FIG. 22 has a bump-forming surface on which are formed a plurality of bumps 74Bi in one row along a short side generally at a center of the substrate in correspondence to the arrangement of the electrode group in the bare chip 38 to be electrically connected thereto, in the modification shown in FIG. 26, bumps 82Ai (i=1 to n, n is a positive integer) arranged in one row generally at a center and bumps 82Bi (i=1 to n, n is a positive integer) arranged along a long side are combined to form a T-shape on an electrode sheet 82.

In FIG. 26, a root of the bump 82Ai, 82Bi made, for example, of copper or others has a diameter of approximately 100 μm and a height of approximately 50 μm projected from a surface of a substrate of the electrode sheet 82. The substrate is made, for example, of polyimide resin to be a thin plate having several tens of micrometers. The respective bumps 82Ai and 82Bi in the electrode sheet 82 are connected to electrode pads 82PE formed at longitudinal opposite sides via predetermined printed circuits. These electrode pads 82PE are electrically connected to the contact group in the main body portion 12 described before. At four positions around the bumps 82Ai and 82Bi, through-holes 82b through which pass coupling pins 36P are formed. Further, at opposite ends of short sides in the electrode sheet 82, cut-out portions 82a into which are inserted latches 22A and 22B are formed.

On the periphery of the bumps 82Bi located in the vicinity of ends of the arrangement of the bumps 82Bi, marks 82PM for positioning the electrode section in the bare chip 38 to the bumps 82Bi in the electrode sheet 82 are provided at two positions in the same plane as that of the bumps 80Ai. Also, a marks 82PM for positioning the electrode section in the bare chip 38 to the bumps 82Ai in the electrode sheet 82 is provided at one position in the same plane as that of the bumps 82Ai. The marks 82PM are used when the positioning of the electrode section of the bare chip 38 to the bumps 82Ai and 82Bi of the electrode sheet 82 is carried out by using the image recognition technique.

Figure 9:
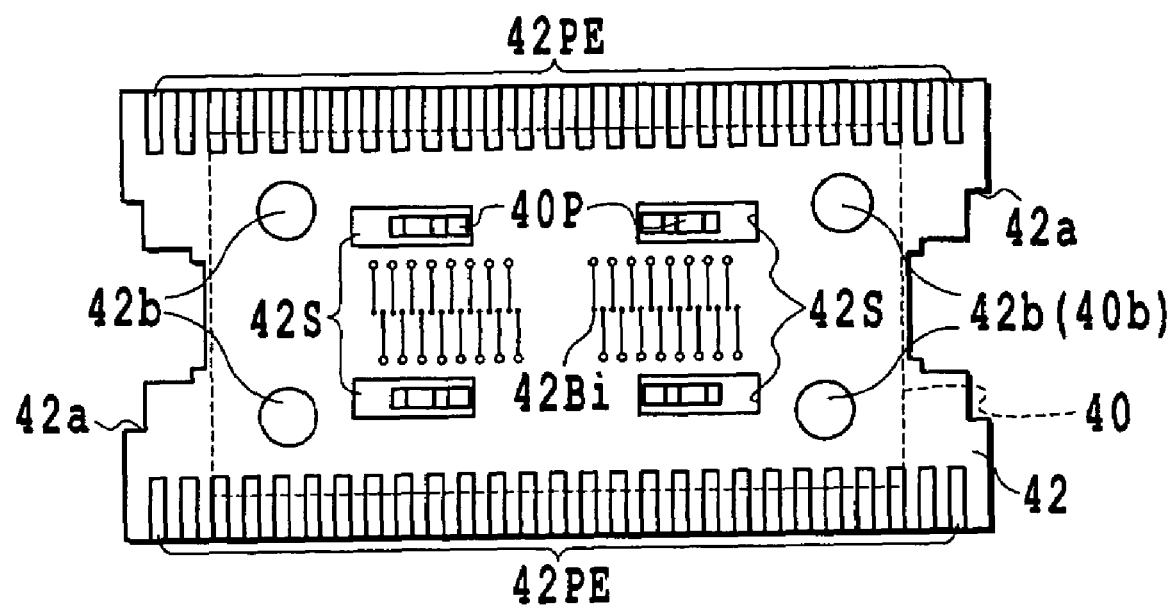
FIG. 9 is a plan view of a second embodiment of the electrode sheet and the posture stabilizing member used in an example of the semiconductor device socket in accordance with the present invention.
Figure 10:
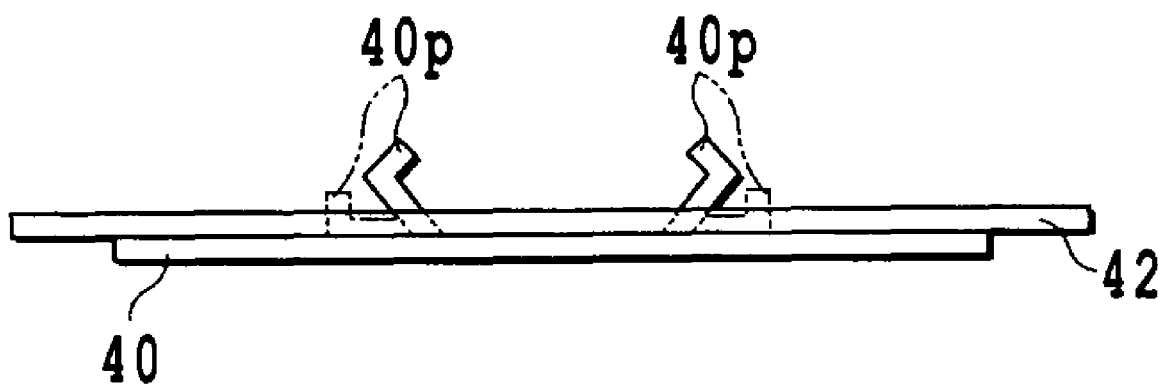
FIG. 10 is a side view of the embodiment shown in FIG. 9.

FIGS. 9 and 10 illustrate a second embodiment of an electrode sheet and a posture-stabilizing member used in the carrier unit described above, respectively.

In the electrode sheet 32 and the posture-stabilizing member 30 shown in FIG. 1, the posture-stabilizing member 30 is placed on the upper surface of the electrode sheet 32. On the other hand, in the embodiment shown in FIGS. 9 and 10, a posture-stabilizing member 40 is disposed at a position on a lower surface of a lower surface of an electrode sheet 42. That is, the electrode sheet 42 is placed on the upper surface of the posture-stabilizing member 40 and projections 40P project upward via slits 42S.

The electrode sheet 42 has a plurality of bumps 42Bi (i=1 to n, n is a positive integer) arranged in one row generally at a center of a substrate in correspondence to the electrode group of a bare chip 38 to be electrically connected thereto, as shown in FIG. 9. A root of the bump 42Bi made, for example, of copper or others has a diameter of approximately 100 μm and a height of approximately 50 μm projected from a surface of a substrate thereof. The substrate is made, for example, of polyimide resin to be a thin plate having several tens of micrometers. The respective bumps 42Bi in the electrode sheet 42 is connected to electrode pads 42PE formed at longitudinal opposite sides via predetermined printed circuits. These electrode pads 42PE are electrically connected to the contact group in the IC socket described before. At four positions around the bumps 42Bi, through-holes 42b through which pass coupling pins 36P are formed. Further, at opposite ends of short sides in the electrode sheet 42, cut-out portions 42a into which are inserted latches 22A and 22B are formed. Further, in FIG. 9, there are two slits 42S provided at a predetermined distance between the through-holes 42b arranged leftward and rightward. In the four slits 42S, projections 40P described later are projected.

The posture-stabilizing member 40 placed on the lower surface of the electrode sheet 42 is made, for example, of polyamide resin to be a thin plate. At positions in the posture-stabilizing member 40 corresponding to the slits 42S of the electrode sheet 42, the projections 40P are formed to be movable as shown by a solid line or a two-dot chain line in FIG. 10. The projections 40P are formed in a common plane so that tip ends of the four projections 40P uniformly support the electrode surface of the bare chip 38. Further, when the bare chip 38 is pressed and electrically connected to the bumps 42Bi, the projection 40P enters the slit 42S as shown by a two-dot chain line so that a position of the tip end thereof is generally in the common plane including the front-most position of the bumps 42Bi.

Even in such a structure, similarly to the above-mentioned embodiment, when the bare chip 38 is mounted, the bare chip 38 is disposed generally parallel to the bump-forming surface of the electrode sheet 42 on which the bumps 42Bi are formed without the inclination of its electrode surface, since the projections 40P of the posture-stabilizing member 40 touch to four positions on the electrode surface of the bare chip 38.

Figure 11:
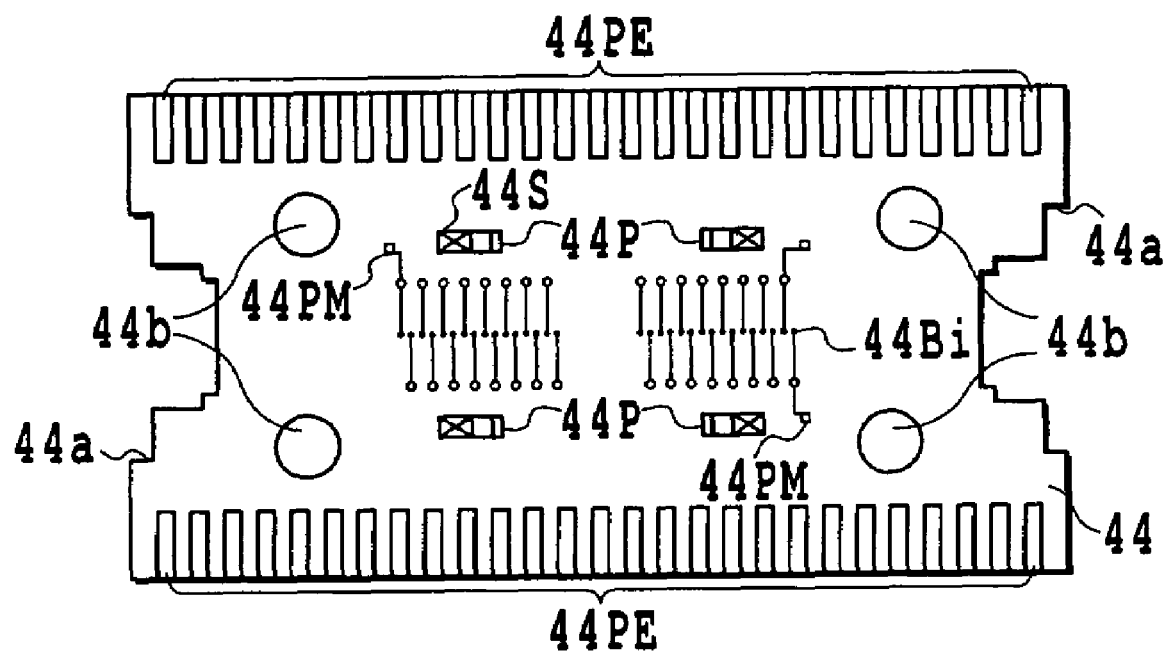
FIG. 11 is a plan view illustrating a third embodiment of the electrode sheet and the posture-stabilizing member used in an example of the semiconductor device socket in accordance with the present invention.
Figure 12:
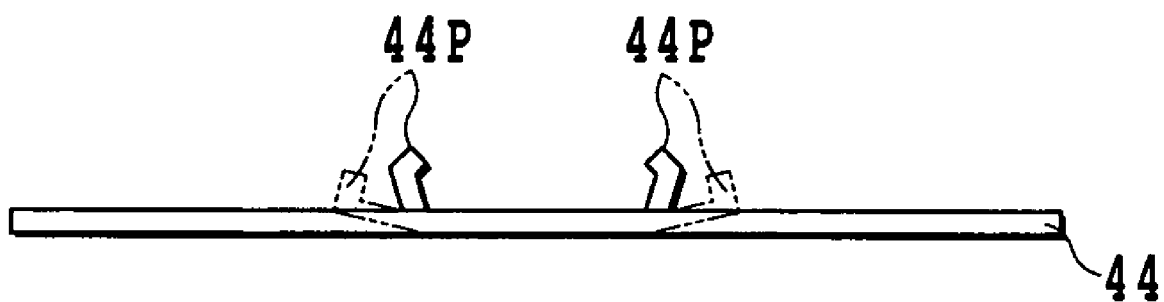
FIG. 12 is a side view of the embodiment shown in FIG. 11.

FIGS. 11 and 12 illustrate a third embodiment of an electrode sheet used in the above-mentioned carrier unit.

While an electrode sheet 32 and a posture-stabilizing member 30 shown in FIG. 1 are individually separable from each other, in the embodiment shown in FIGS. 11 and 12, the electrode sheet 44 has four projections 44P having the function of the above-mentioned posture-stabilizing member as part thereof. Thereby, it is possible to reduce the number of parts and a man-power necessary for the assembly.

The electrode sheet 44 has a plurality of bumps 44Bi (i=1 to n, n is a positive integer) arranged in one row generally at a center of a substrate in correspondence to the electrode group of a bare chip 38 to be electrically connected thereto, as shown in FIG. 11. A root of the bump 44Bi made, for example, of copper or others has a diameter of approximately 100 μm and a height of approximately 50 μm projected from a surface of a substrate thereof. The substrate is made, for example, of polyimide resin to be a thin plate having several tens of micrometers. The respective bumps 44Bi in the electrode sheet 44 is connected to electrode pads 44PE formed at longitudinal opposite sides via predetermined printed circuits. These electrode pads 44PE are electrically connected to the contact group in the IC socket described before. At four positions around the bumps 44Bi, through-holes 44b through which pass coupling pins 36P are formed. Further, at opposite ends of short sides in the electrode sheet 44, cut-out portions 44a into which are inserted latches 22A and 22B are formed. On the periphery of the respective bumps 44Bi located in the vicinity of opposite ends in the arrangement of the bumps 44Bi, marks 44PM for positioning the electrode section of the bare chip 38 to the bumps 44Bi in the electrode sheet 44 are provided at three positions in the same plane as that of the bumps 44Bi. The marks PM are used for positioning the electrode section of the bare chip 38 to the bumps 44Bi of the electrode sheet 44 by using the image recognition technique. Also in the bare chip 38, positioning marks not shown are provided corresponding to the marks 44PM.

In FIG. 11, two slits 44S are formed at a predetermined distance between the through-holes 44b disposed leftward and rightward. On the periphery of the four slits 44S, lower ends of the projections 44P are connected in a movable manner as shown by a two-dot chain line in FIG. 12. The projections 44P are formed in a common plane so that when the bare chip 38 is placed, tip ends of the four projections 44P uniformly support the electrode surface of the bare chip 38.

When the bare chip 38 is pressed and electrically connected to the bumps 44Bi, the projections 44P enter the slits 44S as shown by a two-dot chain line in FIG. 10 so that the tip ends thereof are in the common plane containing the front-most ends of the bumps 44Bi.

Even in such a structure, similarly to the above-mentioned embodiment, since the tip ends of the projections 44P are uniformly brought into contact with four positions on the electrode surface of the bare chip 38 when the bare chip 38 is mounted, the bare chip 38 is disposed, without any inclination, generally parallel to the bump-forming surface of the electrode sheet 44 on which the bumps 44Bi are formed.

Figure 13A:
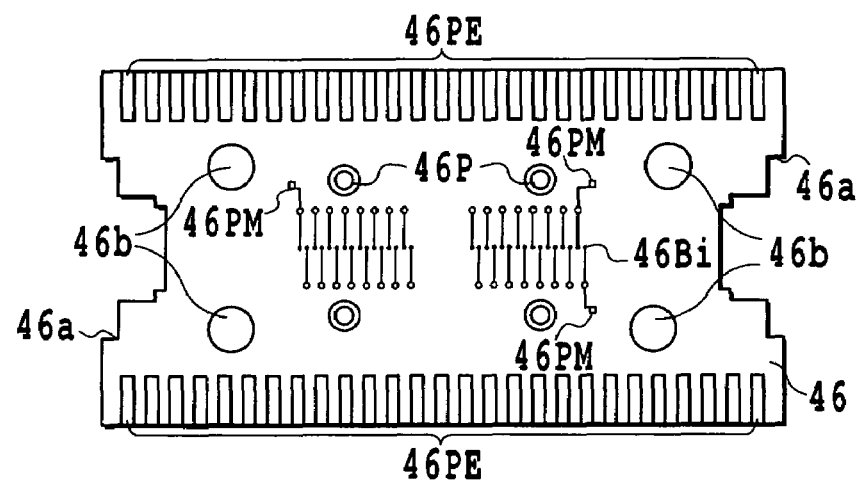
FIG. 13A is a plan view illustrating a fourth embodiment of the electrode sheet and the posture-stabilizing member used in an example of the semiconductor device socket in accordance with the present invention.
Figure 13B:
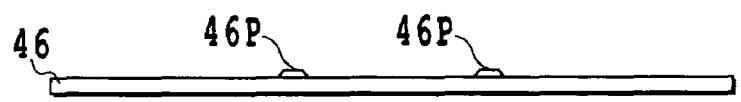
FIG. 13B is a side view of the embodiment shown in FIG. 13A.

FIGS. 13A and 13B illustrate a fourth embodiment of an electrode sheet used in the above-mentioned carrier unit.

While an electrode sheet 32 and a posture-stabilizing member 30 shown in FIG. 1 are individually separable from each other, in the embodiment shown in FIGS. 13A and 13B, the electrode sheet 46 has four projections 46P having the function of the above-mentioned posture-stabilizing member.

The electrode sheet 46 has a plurality of bumps 46Bi (i=1 to n, n is a positive integer) arranged in one row generally at a center of a substrate in correspondence to the electrode group of a bare chip 38 to be electrically connected thereto, as shown in FIG. 13A. A root of the bump 46Bi made, for example, of copper or others has a diameter of approximately 100 μm and a height of approximately 50 μm projected from a surface of a substrate thereof. The substrate is made, for example, of polyimide resin to be a thin plate having several tens of micrometers. The respective bumps 46Bi in the electrode sheet 46 is connected to electrode pads 46PE formed at longitudinal opposite sides via predetermined printed circuits. These electrode pads 46PE are electrically connected to the contact group in the IC socket described before. At four positions around the bumps 46Bi, through-holes 46b through which pass coupling pins 36P are formed. Further, at opposite ends of short sides in the electrode sheet 46, cut-out portions 46a into which are inserted latches 22A and 22B are formed. On the periphery of the respective bumps 46Bi located in the vicinity of opposite ends in the arrangement of the bumps 46Bi, marks 46PM for positioning the electrode section of the bare chip 38 to the bumps 46Bi in the electrode sheet 46 are provided at three positions in the same plane as that of the bumps 46Bi. The marks 46PM are used for positioning the electrode section of the bare chip 38 to the bumps 44Bi of the electrode sheet 44 by using the image recognition technique. Also in the bare chip 38, positioning marks not shown are provided corresponding to the marks 46PM.

In FIG. 13A, two protrusions 46P having the function as the posture-stabilizing member are formed at a predetermined distance between the through-holes 46b disposed leftward and rightward. The four protrusions 46P are elastically deformable in accordance with the movement of the bumps 46Bi due to the pressure of the bare chip 38. A height of the protrusion 46P from the surface of the electrode sheet 46 to a tip end of the former is generally equal to the height of the bump 46Bi. The projections 46P are formed in a common plane so that when the bare chip 38 is placed, tip ends of the four projections 44P uniformly support the electrode surface of the bare chip 38.

Even in such a structure, similarly to the above-mentioned embodiment, since the tip ends of the protrusions 46P are uniformly brought into contact with four positions on the electrode surface of the bare chip 38 when the bare chip 38 is mounted, the bare chip 38 is disposed, without any inclination, generally parallel to the bump-forming surface of the electrode sheet 46 on which the bumps 46Bi are formed.

Figure 14A:
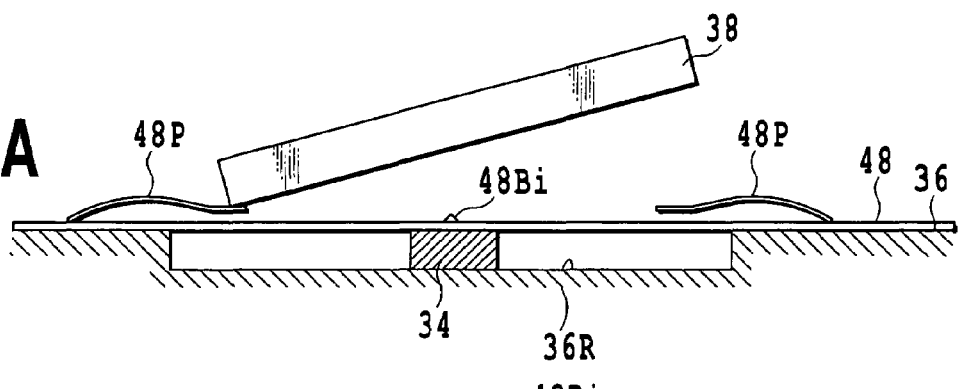
FIGS. 14A, 14B and 14C are partial sectional views made available for explaining the operation of a fifth embodiment of the electrode sheet and the posture-stabilizing member used in an example of the semiconductor device socket in accordance with the present invention, respectively.
Figure 14B:
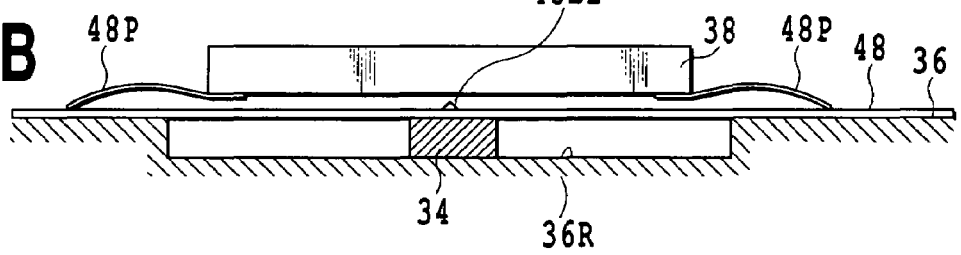
Figure 14C:
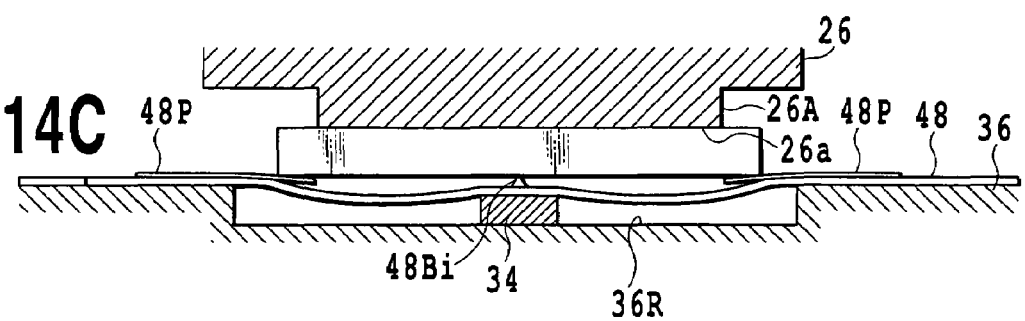

FIGS. 14A, 14B and 14C illustrate a fifth embodiment of the electrode sheet used in the above-mentioned carrier unit.

In the embodiment shown in FIGS. 14A, 14B and 14C, the electrode sheet 48 has, integrally therewith at four positions, elastic pieces 48P having the function as the posture-stabilizing member described before.

The electrode sheet 48 has a plurality of bumps 48Bi (i=1 to n, n is a positive integer) arranged in one row generally at a center of a substrate thereof in correspondence to the electrode group in the bare chip 38 to be electrically connected thereto. For example, a root of the respective bump 48Bi made of copper or others has a diameter of approximately 100 μm and a height of approximately 50 μm projected from the surface of the substrate. The substrate thereof is made, for example, of polyimide resin to be a thin plate having a thickness of approximately several tens of micrometers. The respective bumps 48Bi in the electrode sheet 48 are connected to electrode pad group (not shown) formed at each of opposite ends thereof via a predetermined printed circuits. These electrode pads are electrically connected to the contact group in the IC socket described above.

At four positions around the bumps 48Bi, through-holes (not shown) through which pass coupling pins 36P, respectively, are formed. At opposite ends of short sides of the electrode sheet 48, cut-out portions are formed, into which are inserted the latches 22A and 22B.

In FIG. 14A, two elastic pieces 48P having the function as the posture-stabilizing member are formed opposite to each other at a predetermined distance between the through-holes 46b disposed leftward and rightward. A proximal end of the respective elastic piece 48P is formed integrally with the electrode sheet 48, while a tip end of the respective elastic piece 48P extends inward exceeding the periphery of a recess 36R to the bumps 44Bi. Thereby, the four elastic pieces 48P are deformable in accordance with the elastic deformation of the bump 48Bi due to the pressure of the bare chip 38.

When the bare chip 38 is not mounted, a height of the elastic piece 48P from the surface of the electrode sheet 48 to a tip end of the elastic piece 48P is generally equal or slightly higher than a height of the 48Bi. At that time, the height of the tip end of the respective elastic piece 48 is in a common plane so that the tip ends of the four elastic pieces 48P uniformly support the electrode surface of the bare chip 38 when the bare chip 38 is placed.

Even in such a structure, similarly to the above-mentioned embodiment, since the tip ends of the elastic pieces 48P are uniformly brought into contact with four positions on the electrode surface of the bare chip 38 when the bare chip 38 is mounted, the bare chip 38 is disposed, without any inclination, generally parallel to the bump-forming surface of the electrode sheet 46 on which the bumps 48Bi are formed.

As shown in FIG. 14C, when the bare chip 38 is pressed by the pressing surface 26a of the pressing body 26 against the elasticity of the elastic pieces 48P, the electrode section of the bare chip 38 is electrically connected to the bumps 48Bi, and part of the electrode sheet 48 bends toward the interior of the recess 36R as well as the elastic piece 48P is depressed to the common plane including the tip ends of the bumps 48Bi.

Figure 15:
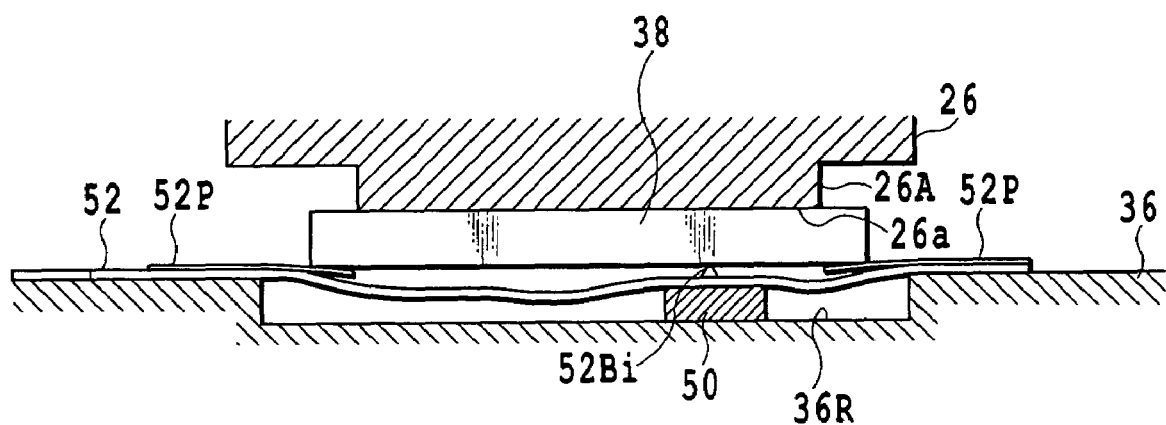
FIG. 15 is a partial sectional view illustrating a modification of the embodiment shown in FIGS. 14A to 14C.

FIG. 15 illustrates a modification of the electrode sheet shown in FIGS. 14A to 14C.

In the modification shown in FIGS. 14A to 14C, a plurality of bumps 48Bi (i=1 to n, n is a positive integer) are arranged on the substrate of the electrode sheet 48 generally at a center thereof in one row in correspondence to the electrode group of the bare chip 38. On the other hand, an electrode sheet 52 shown in FIG. 15 has a plurality of bumps 52Bi (i=1 to n, n is a positive integer) arranged on a substrate in one row deviated generally at a predetermined distance in one direction from a center thereof in correspondence to the electrode group of the bare chip. In this regard, a band-like elastic sheet 50 is arranged in a portion of the bottom surface of the recess 36R beneath the plurality of bumps 52Bi. For example, a root of the respective bump 52Bi made of copper or others has a diameter of approximately 100 μm and a height of approximately 50 μm projected from the surface of the substrate. The substrate thereof is made, for example, of polyimide resin to be a thin plate having a thickness of approximately several tens of micrometers. The respective bump 52Bi in the electrode sheet 52 is connected to an electrode pad 32PE formed at each of opposite ends thereof via a predetermined printed circuit. These electrode pads are electrically connected to the contact group in the IC socket described above.

At four positions on the periphery of the bumps 52Bi, through-holes (not shown) through which pass coupling pins 36P, respectively, are formed. Further, at ends of short sides in the electrode sheet 52, recesses in which the latches 22A and 22B are inserted are formed.

In FIG. 15, two elastic pieces 52P having the function as the posture-stabilizing member are formed opposite to each other at a predetermined distance between the through-holes disposed leftward and rightward. A proximal end of the respective elastic piece 48P is formed integrally with the electrode sheet 52, while a tip end of the respective elastic piece 52P extends inward exceeding the periphery of a recess 36R to the bumps 52Bi. Thereby, the four elastic pieces 52P are deformable in accordance with the elastic deformation of the bump 52Bi due to the pressure of the bare chip 38.

When the bare chip 38 is not mounted, a height of the elastic piece 52P from the surface of the electrode sheet 52 to a tip end of the elastic piece 52P is generally equal or slightly higher than a height of the bump 48Bi. At that time, the height of the tip end of the respective elastic piece 52P is in a common plane so that the tip ends of the four elastic pieces 52P uniformly support the electrode surface of the bare chip 38 when the bare chip 38 is placed.

Even in such a structure, similarly to the above-mentioned embodiment, since the tip ends of the elastic pieces 52P are uniformly brought into contact with four positions on the electrode surface of the bare chip 38 when the bare chip 38 is mounted, the bare chip 38 is disposed, without any inclination, generally parallel to the bump-forming surface of the electrode sheet 46 on which the bumps 52Bi are formed.

As shown in FIG. 15, when the bare chip 38 is pressed by the pressing surface 26a of the pressing body 26 against the elasticity of the elastic pieces 48P, the electrode section of the bare chip 38 is electrically connected to the bumps 52Bi, and part of the electrode sheet 52 bends toward the interior of the recess 36R as well as the elastic piece 52P is depressed to the common plane including the tip ends of the bumps 52Bi.

Figure 16:
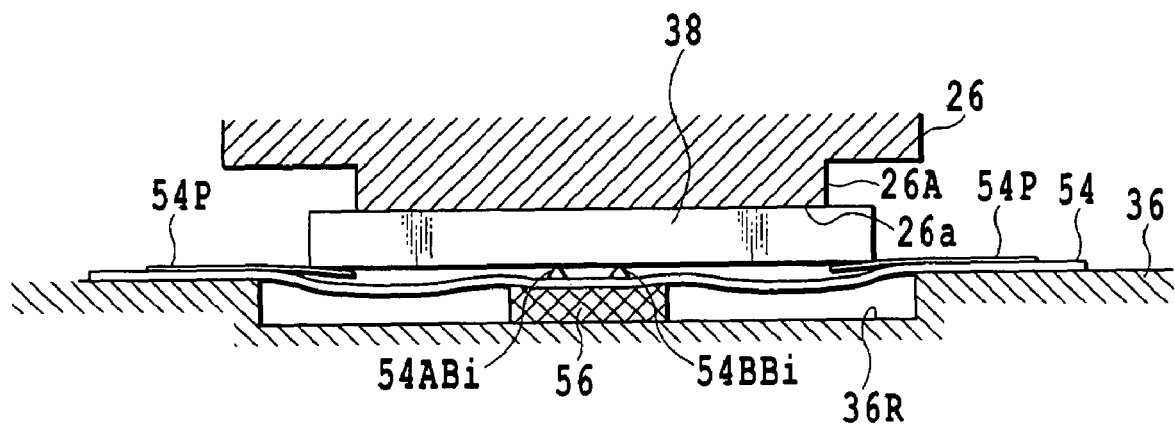
FIG. 16 is a partial sectional view made available for explaining the operation of a sixth embodiment of the electrode sheet and the posture-stabilizing member used in an example of the semiconductor device socket in accordance with the present invention.

FIG. 16 illustrates a sixth embodiment of the electrode sheet used in the above-mentioned carrier unit.

In FIG. 16, an electrode sheet 54 has a plurality of bumps 54ABi and 54BBi (i=1 to n, n is a positive integer) arranged generally at a center of a substrate in two rows at a predetermined distance between the both in correspondence to the arrangement of the electrode groups on the bare chip 38 to be electrically connected thereto. The bumps 54ABi and 54BBi in the respective rows are arranged in the vertical direction relative to the paper surface. Since the bumps 54ABi and 54BBi are of the same structure, the explanation is made solely on the bump 54ABi and that of the bump 54BBi will be eliminated.

For example, a root of the respective bump 54ABi made of copper or others has a diameter of approximately 100 μm and a height of approximately 50 μm projected from the surface of the substrate. The substrate thereof is made, for example, of polyimide resin to be a thin plate having a thickness of approximately several tens of micrometers. The respective bumps 54ABi in the electrode sheet 54 are connected to electrode pad group formed at each of opposite ends thereof via predetermined printed circuits. These electrode pads are electrically connected to the contacts 14ai in the IC socket described above.

At four positions around the bumps 54Bi, through-holes (not shown) through which pass coupling pins 36P, respectively, are formed. At opposite ends of short sides of the electrode sheet 54, cut-out portions (not shown) are formed, into which are inserted the latches 22A and 22B.

In FIG. 16, two elastic pieces 54P having the function as the posture-stabilizing member are formed opposite to each other at a predetermined distance between the through-holes disposed leftward and rightward. A proximal end of the respective elastic piece 54P is formed integrally with the electrode sheet 54, while a tip end of the respective elastic piece 54P extends inward exceeding the periphery of a recess 36R to the bumps 54Bi. Thereby, the four elastic pieces 54P are deformable in accordance with the elastic deformation of the bump 54Bi due to the pressure of the bare chip 38. When the bare chip 38 is not mounted, a height of the elastic piece 54P from the surface of the electrode sheet 54 to a tip end of the elastic piece 54P is generally equal or slightly higher than a height of the 54Bi. When the bare chip 38 is placed on the tip ends of the elastic pieces 54P, the height of the tip end of the respective elastic piece 54 is in a common plane so that the tip ends of the four elastic pieces 54P uniformly support the electrode surface of the bare chip 38 when the bare chip 38 is placed.

At a position beneath the electrode sheet 54 corresponding to the bumps 54Bi, a band-like elastic sheet 56 is provided in a portion of a bottom wall of the recess 36R. Note the elastic sheet 56 may be provided to cover all over the bottom wall of the recess as shown in FIGS. 16 and 19.

Even in such a structure, similarly to the above-mentioned embodiment, since the tip ends of the elastic pieces 54P are uniformly brought into contact with four positions on the electrode surface of the bare chip 38 when the bare chip 38 is mounted, the bare chip 38 is disposed, without any inclination, generally parallel to the bump-forming surface of the electrode sheet 54 on which the bumps 54Bi are formed.

As shown in FIG. 16, when the bare chip 38 is pressed by the pressing surface 26a of the pressing body 26 against the elasticity of the elastic pieces 54P, the electrode section of the bare chip 38 is electrically connected to the bumps 54Bi, and part of the electrode sheet 54 bends toward the interior of the recess 36R as well as the elastic piece 54P is depressed to the common plane including the tip ends of the bumps 54Bi.

Figure 17:
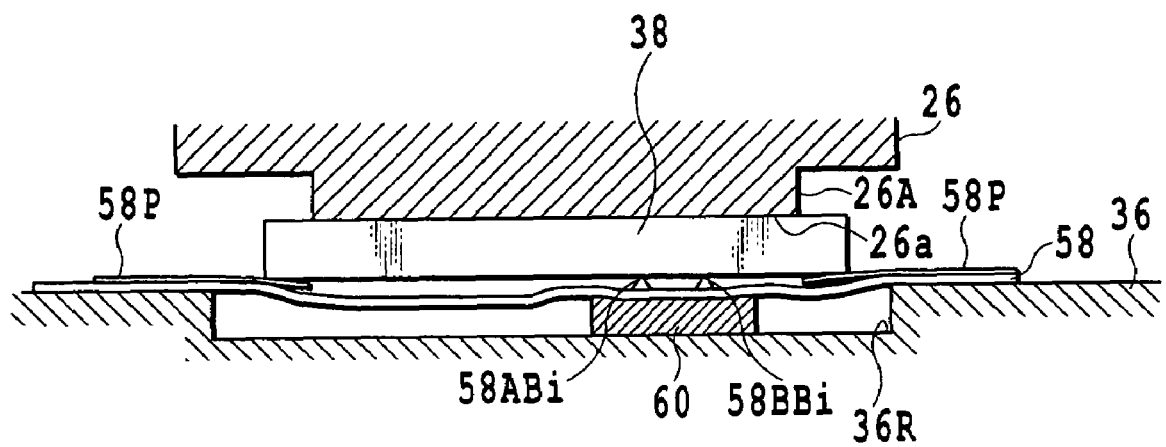
FIG. 17 is a partial sectional view illustrating a modification of the embodiment shown in FIG. 16.

FIG. 17 illustrates a modification of the electrode sheet shown in FIG. 16.

In the modification shown in FIG. 16, a plurality of bumps 54ABi, 54BBi (i=1 to n, n is a positive integer) are arranged on the substrate generally at a center thereof in two rows in correspondence to the electrode group of the bare chip 38. On the other hand, an electrode sheet 58 shown in FIG. 17 has a plurality of bumps 52ABi, 52BBi (i=1 to n, n is a positive integer) arranged on a substrate in two rows deviated at a predetermined distance in one direction generally from a center thereof in correspondence to the electrode group of the bare chip 38. The bumps 58ABi, 58BBi in the respective rows are arranged in the direction vertical to the paper surface. In this regard, a band-like elastic sheet 60 is arranged in a portion of the bottom surface of the recess 36R beneath the plurality of bumps 58ABi and 58BBi. Since the bumps 58ABi and 58BBi are of the same structure, the explanation is made solely on the bump 58ABi and that on the bump 58BBi will be eliminated.

For example, a root of the respective bump 58ABi made of copper or others has a diameter of approximately 100 μm and a height of approximately 50 μm projected from the surface of the substrate. The substrate thereof is made, for example, of polyimide resin to be a thin plate having a thickness of approximately several tens of micrometers. The respective bump 52ABi in the electrode sheet 58 is connected to an electrode pad group formed at each of opposite ends thereof via a predetermined printed circuit. These electrode pad group are electrically connected to the contact group in the IC socket described above.

At four positions on the periphery of the bumps 58Bi, through-holes (not shown) through which pass coupling pins 36P, respectively, are formed. Further, at ends of short sides in the electrode sheet 58, recesses in which the latches 22A and 22B are inserted are formed.

In FIG. 17, two elastic pieces 582P having the function as the posture-stabilizing member are formed opposite to each other at a predetermined distance between the through-holes disposed leftward and rightward. A proximal end of the respective elastic piece 58P is formed integrally with the electrode sheet 582, while a tip end of the respective elastic piece 58P extends inward exceeding the periphery of a recess 36R to the bumps 58Bi. Thereby, the four elastic pieces 58P are deformable in accordance with the elastic deformation of the bump 58Bi due to the pressure of the bare chip 38.

When the bare chip 38 is not mounted, a height of the elastic piece 58P from the surface of the electrode sheet 58 to a tip end of the elastic piece 58P is generally equal or slightly higher than a height of the bump 58Bi. At that time, the height of the tip end of the respective elastic piece 58P is in a common plane so that the tip ends of the four elastic pieces 58P uniformly support the electrode surface of the bare chip 38 when the bare chip 38 is placed.

Even in such a structure, since the tip ends of the elastic pieces 58P are uniformly brought into contact with four positions on the electrode surface of the bare chip 38 when the bare chip 38 is mounted, the bare chip 38 is disposed, without any inclination, generally parallel to the bump-forming surface of the electrode sheet 58 on which the bumps 58Bi are formed.

As shown in FIG. 17, when the bare chip 38 is pressed by the pressing surface 26a of the pressing body 26 against the elasticity of the elastic pieces 58P, the electrode section of the bare chip 38 is electrically connected to the bumps 58Bi, and part of the electrode sheet 58 bends toward the interior of the recess 36R as well as the elastic piece 58P is depressed to the common plane including the tip ends of the bumps 58Bi.

The present invention has been described in detail with respect to preferred embodiments, and it will now be apparent from the foregoing to those skilled in the art that changes and modifications may be made without departing from the invention in its broader aspect, and it is the intention, therefore, in the apparent claims to cover all such changes.

What is claimed is:

1. A carrier unit for a semiconductor device comprising:
   an electrode sheet having a bump-forming surface on which are formed bumps to be electrically connected to terminals of a semiconductor device;
   a posture-stabilizing member disposed on said bump-forming surface of said electrode sheet, having an opening through which pass the terminals of said semiconductor device and said bumps, said member for stabilizing a posture of a connecting surface of said semiconductor device, on which the terminals of said semiconductor device are formed, to be generally parallel to said bump-forming surface of said electrode sheet; and a housing member having an accommodating portion for accommodating said electrode sheet and said posture-stabilizing member.

2. A carrier unit for a semiconductor device as claimed in claim 1, further comprising a pressing body for pressing the terminals of said semiconductor device onto said bumps on said electrode sheet at a predetermined pressure via the opening of said posture-stabilizing member.

3. A carrier unit for a semiconductor device as claimed in claim 1, wherein said electrode sheet and said posture-stabilizing member are formed in integral with each other.

4. A carrier unit for a semiconductor device as claimed in claim 1, wherein an elastic sheet is provided in the accommodating portion of said housing member at a position beneath said electrode sheet and said posture-stabilizing member.

5. A carrier unit for a semiconductor device as claimed in claim 4, wherein said elastic sheet is provided in a part of a bottom wall of the accommodating portion in said housing member.

6. A socket for a semiconductor device comprising:

a carrier unit for a semiconductor device as claimed in claim 1;

a socket body having an accommodation portion for accommodating said carrier unit for a semiconductor device; and a contact terminal provided in said socket body, for being connected to an electrode pad of an electrode sheet in said carrier unit for a semiconductor device.

7. A socket for a semiconductor device comprising:

a carrier unit for a semiconductor device as claimed in claim 2;

a socket body having an accommodation portion for accommodating said carrier unit for a semiconductor device; and a contact terminal provided in said socket body, for being connected to an electrode pad of an electrode sheet in said carrier unit for a semiconductor device.

8. A socket for a semiconductor device comprising:

a carrier unit for a semiconductor device as claimed in claim 3;

a socket body having an accommodation portion for accommodating said carrier unit for a semiconductor device; and a contact terminal provided in said socket body, for being connected to an electrode pad of an electrode sheet in said carrier unit for a semiconductor device.

9. A socket for a semiconductor device comprising:

a carrier unit for a semiconductor device as claimed in claim 4;

a socket body having an accommodation portion for accommodating said carrier unit for a semiconductor device; and a contact terminal provided in said socket body, for being connected to an electrode pad of an electrode sheet in said carrier unit for a semiconductor device.

* * * * *